United States Patent
Shen et al.

(10) Patent No.: US 11,232,988 B2
(45) Date of Patent: Jan. 25, 2022

(54) WAVY PROFILE MITIGATION

(71) Applicant: Taiwan Semiconductor Manufacturing Co., Ltd., Hsin-Chu (TW)

(72) Inventors: Shu-Wen Shen, Hsinchu (TW); You-Ting Lin, Hsinchu (TW); Jiun-Ming Kuo, Taipei (TW); Yuan-Ching Peng, Hsinchu (TW); Yi-Cheng Li, Hsinchu (TW); Pin-Ju Liang, Hsinchu (TW); Pei-Ren Jeng, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/888,515

(22) Filed: May 29, 2020

(65) Prior Publication Data

US 2021/0375688 A1    Dec. 2, 2021

(51) Int. Cl.
*H01L 21/8234* (2006.01)
*H01L 29/786* (2006.01)
(Continued)

(52) U.S. Cl.
CPC ............ *H01L 21/823431* (2013.01); *H01L 21/823481* (2013.01); *H01L 29/42392* (2013.01); *H01L 29/66545* (2013.01); *H01L 29/78696* (2013.01)

(58) Field of Classification Search
CPC ............ H01L 21/822; H01L 21/8232; H01L 21/8234; H01L 21/82343; H01L 21/823481; H01L 21/823487; H01L 21/8238; H01L 21/823821; H01L 21/823878; H01L 21/823885; H01L 29/1029; H01L 29/1033; H01L 29/401; H01L 29/41; H01L 29/413; H01L 29/42312; H01L 29/4232; H01L 29/42392; H01L 29/66477; H01L 29/66545; H01L 29/76; H01L 29/772; H01L 29/78;
(Continued)

(56) References Cited

U.S. PATENT DOCUMENTS 9,711,608 B1 * 7/2017 Duriez .............. H01L 29/66545
9,818,872 B2   11/2017 Ching et al.
(Continued)

*Primary Examiner* — Cheung Lee
(74) *Attorney, Agent, or Firm* — Haynes and Boone, LLP

(57) ABSTRACT

Methods of rectifying a sidewall profile of a fin-shaped stack structure are provided. An example method includes forming, on a substrate, a first fin-shaped structure and a second fin-shaped structure each including a plurality of channel layers interleaved by a plurality of sacrificial layers; depositing a first silicon liner over the first fin-shaped structure and the second fin-shaped structure; depositing a dielectric layer over the substrate, the first fin-shaped structure and the second fin-shaped structure; etching back the dielectric layer to form an isolation feature between the first fin-shaped structure and the second fin-shaped structure and to remove the first silicon liner over the first fin-shaped structure and the second fin-shaped structure to expose sidewalls of the plurality of channel layers and the plurality of sacrificial layers, and epitaxially depositing a second silicon liner over the exposed sidewalls of the plurality of channel layers and the plurality of sacrificial layers.

20 Claims, 32 Drawing Sheets

(51) Int. Cl.
*H01L 29/423* (2006.01)
*H01L 29/66* (2006.01)

(58) Field of Classification Search
CPC .............. H01L 29/785; H01L 29/786; H01L 29/78642; H01L 29/78696
See application file for complete search history.

(56) References Cited

U.S. PATENT DOCUMENTS

| | | |
|---|---|---|
| 9,887,269 B2 | 2/2018 | Ching et al. |
| 9,899,398 B1 | 2/2018 | Colinge et al. |
| 10,032,627 B2 | 7/2018 | Lee et al. |
| 10,109,721 B2 | 10/2018 | Lin et al. |
| 10,157,799 B2 | 12/2018 | Ching et al. |
| 10,199,502 B2 | 2/2019 | Huang et al. |
| 10,290,546 B2 | 5/2019 | Chiang et al. |
| 10,475,902 B2 | 11/2019 | Lee et al. |
| 2018/0175036 A1 | 6/2018 | Ching et al. |

* cited by examiner

WAVY PROFILE MITIGATION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device fabrication are needed.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor. To form the channel members of an MBC transistor, layers of two different semiconductor compositions are alternatingly deposited on a substrate and a fin-shaped structure is formed out of these layers. Despite use of an anisotropic etch process, different semiconductor layers may be etched at different rates, resulting in a wavy sidewall profile of the fin-shaped structure. When a gate-last process is adopted, a dummy gate stack is first form over the fin-shaped structure as a placeholder for a functional gate structure. The wavy sidewall profile of the fin-shaped structure may make hinder the removal of the dummy gate stack and impact the yield. Therefore, although conventional MBC transistor formation processes are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
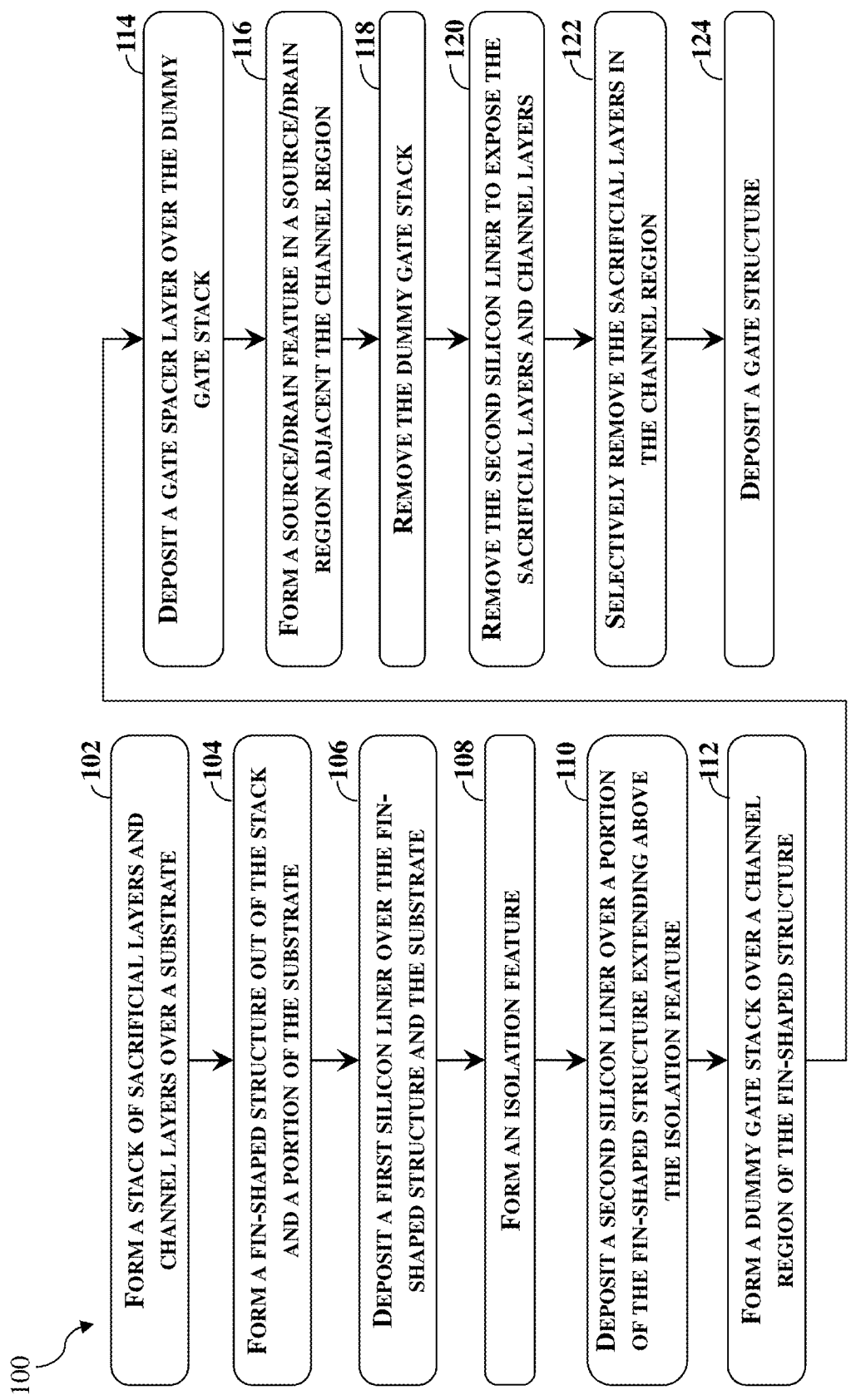
FIG. 1 is a flow chart of a method for fabricating a semiconductor device on a workpiece, according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Multi-gate devices, such as MBC transistors, have been introduced to improve gate control by increasing gate-channel coupling, reducing off-state current, and reducing short-channel effects (SCEs). As described above, an MBC transistor may also be referred to as a SGT transistor, a GAA transistor, a nanosheet transistor, or a nanowire transistor. An MBC transistor has a gate structure that can extend, partially or fully, around a channel region to provide access to the channel region on two or more sides. To form the channel members of an MBC transistor, layers of two different semiconductor compositions are alternatingly deposited on a substrate to form a stack. By design, the two different semiconductor compositions have different etch selectivities with respect to at least one etch process such that layers of one semiconductor composition may be selectively removed while layers of the other semiconductor composition may remain to serve as channel members. The layers that are to be removed may be referred to sacrificial layers and the layers that remain may referred to a channel layers. After the layers are deposited on a substrate, they are patterned into fin-shaped structures using an anisotropic etch process that etches through the interleaving sacrificial layers and channel layers. Despite use of the anisotropic process, etchants in the anisotropic process may etch the two semiconductor compositions at different rates. In examples where the channel layers consist essentially of silicon (Si) and the sacrificial layers consist essentially of silicon germanium (SiGe), the anisotropic etch process etches the sacrificial layers at a rate greater than a rate it does the channel layers. Such etch rate difference has been observed to cause a wavy sidewall profile where the sidewall profile protrudes at the channel layers and recesses at the sacrificial layers. In gate-last processes where an earlier-formed dummy gate stack serves as a placeholder for a later-formed replacement gate structure, the dummy gate stack needs to be removed and replaced by the gate structure. The recesses at the sacrificial layers may harbor dummy gate stack material, preventing complete removal of the dummy gate stack. In order to ensure complete removal of the dummy gate stack, an over-etch may be used. While such an over-etch may remove the dummy gate stack material in the recesses, the over-etch may also damage the source/drain features, resulting in pits in epitaxial features.

The present disclosure provides methods for rectifying the wavy sidewall profiles of the fin-shaped structures. After the formation of the fin-shaped structure, a method according to an embodiment epitaxially deposits a first silicon liner on the fin-shaped structure. It has been observed that depending on the process parameters and precursors, the first silicon liner may have a greater thickness on silicon germanium surfaces and a smaller thickness on silicon surfaces. The first silicon liner may therefore compensate for the recesses in the sacrificial layers and rectify the wavy sidewall profile. In instances where the first silicon liner is removed during formation of isolation features among fin-shaped structures, a second silicon liner may be epitaxially deposited on the fin-shaped structure. A dummy gate stack, including a dummy dielectric layer and a dummy electrode layer, is formed on either the first silicon liner or the second silicon liner, as the case may be. When the dummy gate stack is removed, a separate removal process may be needed to remove the remaining first silicon liner or the second silicon liner in the channel region. By rectifying the sidewall profile of the fin-shaped structure, methods of the present disclosure facilitate complete removal of the sacrificial layers and reduces the risk of damaging the source/drain features.

The various aspects of the present disclosure will now be described in more detail with reference to the figures. In that regard, FIGS. 1 and 17 are flowchart illustrating methods 100 and 300 of forming a semiconductor device from a workpiece 200 according to embodiments of the present disclosure. Methods 100 and 300 are merely examples and are not intended to limit the present disclosure to what is explicitly illustrated in methods 100 and 300. Additional steps can be provided before, during and after the methods 100 and 300, and some steps described can be replaced, eliminated, or moved around for additional embodiments of the methods. Not all steps are described herein in detail for reasons of simplicity. Methods 100 and 300 are described below in conjunction with FIGS. 2-16 and FIGS. 18-31, respectively, which are fragmentary cross-sectional views of the workpiece at different stages of fabrication according to embodiments of methods 100 and 300. Because a semiconductor device will be formed from the workpiece 200 after the fabrication process concludes, the workpiece 200 may also be referred to as the semiconductor device 200 from time to time throughout the present disclosure for convenience. The semiconductor device 200 can be included in a microprocessor, a memory, and/or other IC device. In some implementations, the semiconductor device 200 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof.

Figure 2:
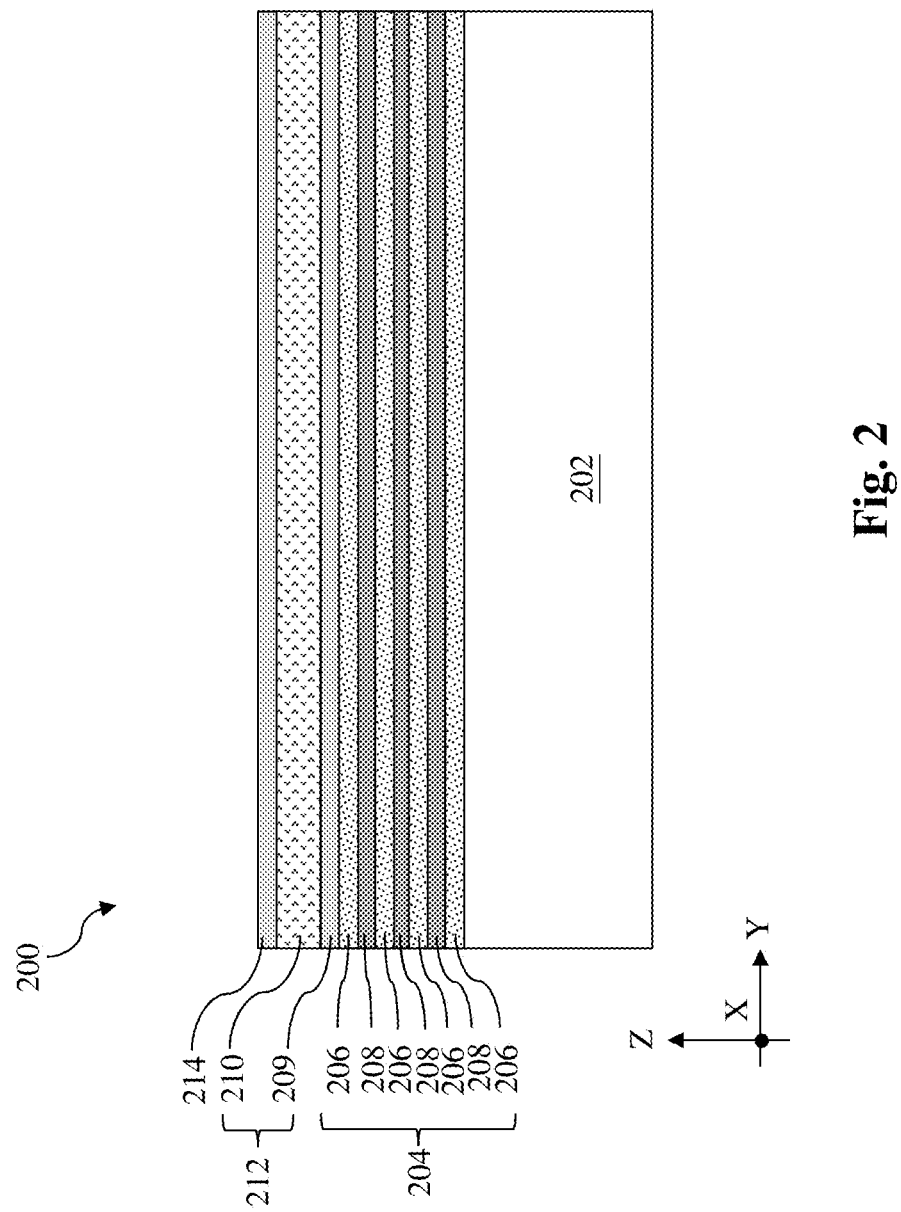
FIGS. 2-16 are fragmentary cross-sectional views of the workpiece at various steps of the method of FIG. 1, according to aspects of the present disclosure.

Referring to FIGS. 1 and 2, method 100 includes a block 102 where a stack 204 of sacrificial layers 206 and channel layers 208 is formed on a substrate 202. As illustrated in FIG. 2, the sacrificial layers 206 and the channel layers 208 in the stack 204 are deposited alternatingly such that the sacrificial layers 206 are interleaved by the channel layers 208 and vice versa. The sacrificial layers 206 and the channel layers 208 are formed of different semiconductor materials configured to allow selective removal of sacrificial layers 206 without substantially damaging the channel layers 208. In an embodiment, the sacrificial layers 206 include silicon germanium (SiGe) and the channel layers 208 include silicon (Si). In this embodiment, the sacrificial layers 206 include a germanium concentration between about 30% and about 45%. By way of example, the sacrificial layers 206 and the channel layers 208 in the stack 204 may be formed by a molecular beam epitaxy (MBE) process, a vapor phase epitaxy (VPE) process, an ultra-high-vacuum chemical vapor deposition (UHV-CVD) process, a metalogranic chemical vapor deposition (MOCVD) process, and/ or other suitable epitaxial growth processes.

Other semiconductor materials for the sacrificial layers 206 and the channel layers 208 are fully envisioned. In some alternative embodiments, the sacrificial layers 206 and the channel layers may include other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. As described above, the materials of the sacrificial layers 206 and the channel layers 208 may be chosen such that the sacrificial layers 206 may be selectively removed or recessed without substantially damaging the channel layers 208.

It is noted that four (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of sacrificial layers and channel layers may be formed in the stack 204. The number of layers depends on the desired number of channels members for the semiconductor device 200. In some embodiments, the number of channel layers 208 is between 2 and 10. In some embodiments, all sacrificial layers 206 may have a substantially uniform first thickness and all of the channel layers 208 may have a substantially uniform second thickness. The first thickness and the second thickness may be identical or different. The channel layers 208 or parts thereof may serve as channel member(s) for a subsequently-formed multi-gate device and the thickness of each of the channel layers 208 is chosen based on device performance considerations. The sacrificial layers 206 may eventually be removed and serve to define a vertical distance between adjacent channel region(s) for a subsequently-formed multi-gate device and the thickness of each of the sacrificial layers 206 is chosen based on device performance considerations.

Figure 3:
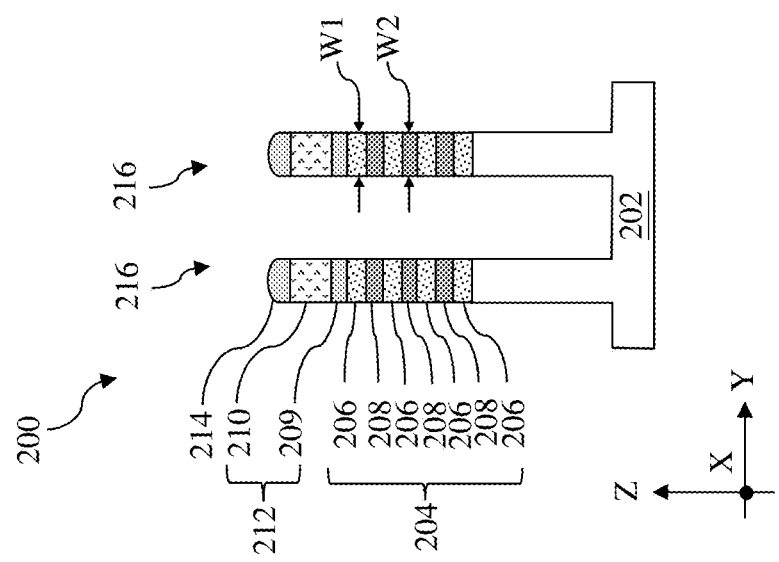

Referring to FIGS. 1, 2 and 3, method 100 includes a block 104 where a fin-shaped structure 216 is formed out of the stack 204 and a portion of the substrate 202. The fin-shaped structure 216 may be formed out of the stack 204 and a portion of the substrate 202 using a combination of photolithography processes and etch processes. That is, the resulting fin-shaped structure 216 includes a bottom portion formed of the substrate 202 and a top portion formed of the stack 204. To form the pattern the fin-shaped structure 216, a hard mask layer 212 may be deposited over the stack 204. The hard mask layer 212 may be a single layer or a multi-layer. In embodiments represented in FIG. 2, the hard mask layer 212 includes a first fin-top hard mask layer 209 and a second fin-top hard mask layer 210. In some implementations, the first fin-top hard mask layer 209 includes silicon oxide and the second fin-top hard mask layer 210 includes silicon nitride or silicon carbonitride. In some implementations, a planarization layer 214 is deposited on the hard mask layer 212. The planarization layer 214 is formed of dielectric material having a similar mechanical property to that of the isolation feature (described below) to facilitate a planarization process, such as a chemical mechanical polishing (CMP) process. In some instances, the planarization layer 214 may be formed of silicon oxide.

At block 104, the planarization layer 214, the hard mask layer 212, the stack 204 and the substrate 202 are patterned using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etch process may include an anisotropic etch process, such as a dry etch process (e.g., reactive ion etching (RIE)). In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The patterned material layer is then removed, and the remaining spacers, or mandrels, may then be used to pattern the fin-shaped structures 216 by etching the stack 204 and the substrate 202.

FIG. 3 illustrate two of fin-shaped structures 216 formed using the operations at block 104. In some instances, because sacrificial layers 206 and the channel layers 208 are etched at different rates during the anisotropic etch process, the sidewalls of the fin-shaped structures 216 may not be smooth and straight. In some implementations illustrated in FIG. 3, each of the sacrificial layers 206 has a first width W1 along the Y direction and each of the channel layers 208 has a second width W2 along the Y direction. In these implementations, the germanium containing sacrificial layers 206 may etch faster than the silicon containing channel layers 208 such that the second width W2 is greater than the first width W1. In some instances, a difference D between the second width W2 and the first width W1 (i.e., W2−W1=D). The difference may be between about 2 nm and about 3 nm. Considering that each of the fin-shaped structures 216 has two sides along the Y direction, on each side of the fin-shaped structure 216, a sacrificial layer has a recess (shown in FIG. 32) that has a Y-direction dimension between about 1 nm and about 1.5 nm (i.e., D/2).

Figure 32:
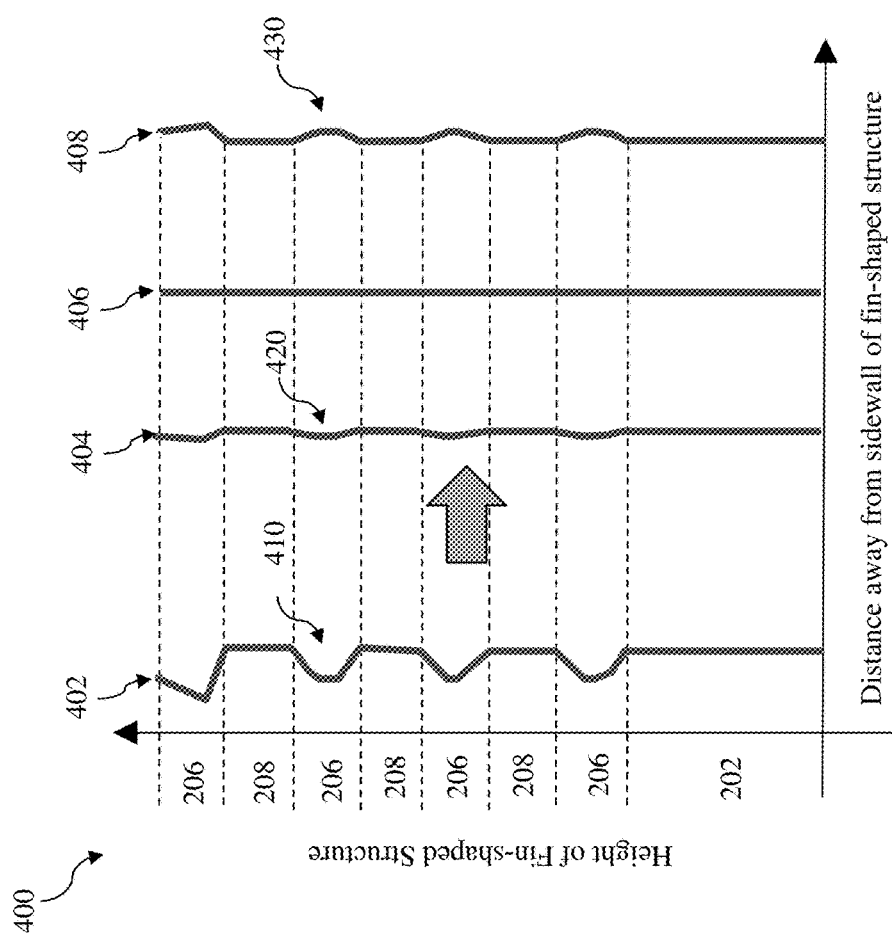
FIG. 32 is a schematic illustrate of sidewall profile of a fin-shaped structure, according to aspects of the present disclosure.

A first sidewall profile 402 of the fin-shaped structure 216 at block 104 is schematically illustrated in FIG. 32. As shown therein, the anisotropic etch process at block 104 may etch the sacrificial layers 206 more than the channel layers 208. The first sidewall profile 402 thus includes a number of recesses 410 at the sacrificial layer 206 levels. In some instances, each of the recesses 410 may have a Y-direction depth between about 1 nm and about 1.5 nm. It is noted that the recesses 410 may not be readily observable in FIG. 3. The recesses 410 may be magnified by subsequent layers, such as the dummy dielectric layer, and may lead to incomplete removal of the dummy gate stack (to be described below).

Figure 4:
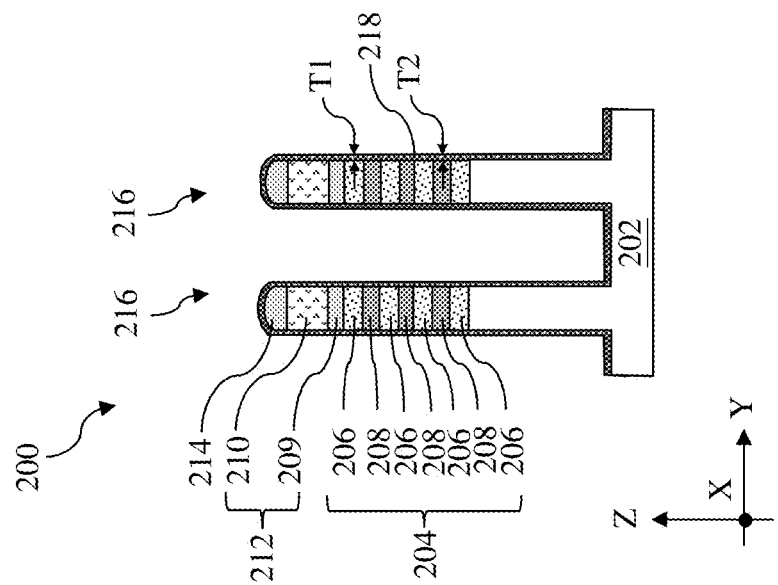

Referring to FIGS. 1 and 4, method 100 includes a block 106 where a first silicon liner 218 is deposited over the fin-shaped structure 216 and the substrate 202. The first silicon liner 218 may be deposited using an epitaxial deposition process, such as an MBE process, a VPE process, an UHV-CVD process, an MOCVD process, and/or other suitable epitaxial growth processes. In some embodiments represented in FIG. 4, the first silicon liner 218 may be epitaxially grown in a less selective setting on the workpiece 200, including on the surfaces of the substrate 202, sidewalls of the fin-shaped structures 216, sidewalls of the hard mask layer 212, sidewalls of the planarization layer 214, and top surfaces of the planarization layer 214. In other embodiments not explicitly shown, the first silicon liner 218 may be epitaxially and selectively grown from semiconductor surfaces, such as surfaces of the stack 204 and the substrate 202. In both cases, the first silicon liner 218 is deposited on the surfaces of the substrate 202, the sacrificial layers 206, and the channel layers 208. In an example epitaxial deposition process, a silicon-containing precursor, such as mono-silane ($SiH_4$) or disilane ($Si_2H_6$) may be used as a silicon precursor. In implementations where mono-silane is used, the epitaxial deposition process may include a process temperature between about 480° C. and about 520° C., such as about 500° C. In implementations where disilane is used, the epitaxial deposition process may include a process temperature between about 360° C. and about 400° C., such as about 380° C.

In one embodiment, the first silicon liner 218 may be deposited at different rates on surfaces of channel layers 208 and sacrificial layers 206. In the depicted embodiments, the first silicon liner 218 deposits on sacrificial layers 206 at a rate greater than it does on the channel layers 208. As a result, the first silicon liner 218 may have a first thickness T1 on the sacrificial layers 206 and a second thickness T2 on the channel layers 208. The second thickness T2 is smaller than the first thickness T1. In the depicted embodiments, the second thickness T2 is between about 1.5 nm and about 2.0 nm. Although the exact mechanism resulting in the deposition rate difference is still being investigated, it is widely believed that differences in incubation time and lattice constant mismatch are likely the origin. Here, incubation refers to the probability of the precursor, such as mono-silane or disilane, sticks on the surface and lattice constant mismatch refers to the different lattice constants of silicon and germanium. It is hypothesized that the silicon-containing precursors may have higher probability to stick on surfaces of sacrificial layers 206 (formed of silicon germanium) or that the lattice mismatch may cause the first silicon liner 218 to have a more defective crystalline structure locally near surfaces of the sacrificial layers 206. The higher probability of sticking (i.e., greater sticking coefficient) leads to a greater deposition rate and the more defective crystalline structure may lead to an increased volume due to presence of dislocations and voids. Either case may give an appearance of greater deposition rate on surfaces of the sacrificial layers 206.

Reference is made to FIG. 32. Even when the fin-shaped structure 216 has the wavy first sidewall profile 402, deposition of the first silicon liner 218 on the fin-shaped structure 216 at block 106 may result in different sidewall profiles. A second sidewall profile 404 represents the situation where the recesses 410 are incompletely compensated by the deposition of the first silicon liner 218 such that the recesses 410 become shallow recesses 420. A third sidewall profile 406 represents the situation where the recesses 410 are completely compensated by the deposition of the first silicon liner 218 such that the recesses 410 are smoothed out. A fourth sidewall profile 408 represents the situation where the recesses 410 are overly compensated by the deposition of the first silicon liner 218 such that ridges 430 are formed over the recesses 410. Referring to FIGS. 3 and 4, mathematically, the second sidewall profile 404 represents a situation where a sum of the first width W1 and twice the first thickness T1 (i.e., W1+2T1) is smaller than a sum of the second width W2 and twice the second thickness T2 (i.e., W2+2T2); the third sidewall profile 406 represents a situation where a sum of the first width W1 and twice the first thickness T1 (i.e., W1+2T1) is equal to a sum of the second width W2 and twice the second thickness T2 (i.e., W2+2T2); and the fourth sidewall profile 408 represents a situation where a sum of the first width W1 and twice the first thickness T1 (i.e., W1+2T1) is greater than a sum of the second width W2 and twice the second thickness T2 (i.e., W2+2T2).

According to the present disclosure, the deposition of the first silicon liner 218 may be controlled to achieve the various sidewall profiles in FIG. 32 by applying different deposition process durations, different precursor species, and different process temperatures. For example, because di-silane has a greater reactivity or sticking coefficient than mono-silane, use of disilane as the precursor at block 106 may enhance the difference in deposition rates of the first silicon liner 218 while use of mono-silane as the precursor at block 106 may reduce the difference in deposition rates of the first silicon liner 218. For another example, when the first silicon liner 218 is formed to a greater thickness, the difference in deposition rates may cause a greater thickness difference on surfaces of sacrificial layers 206 and channel layers 208. For yet another example, precursors for formation of the first silicon liner 218 generally have a greater reactivity at a higher temperature. When the process temperature is increased, the difference in deposition rates on surfaces of sacrificial layers 206 and channel layers 208 may be enhanced.

Figure 5:
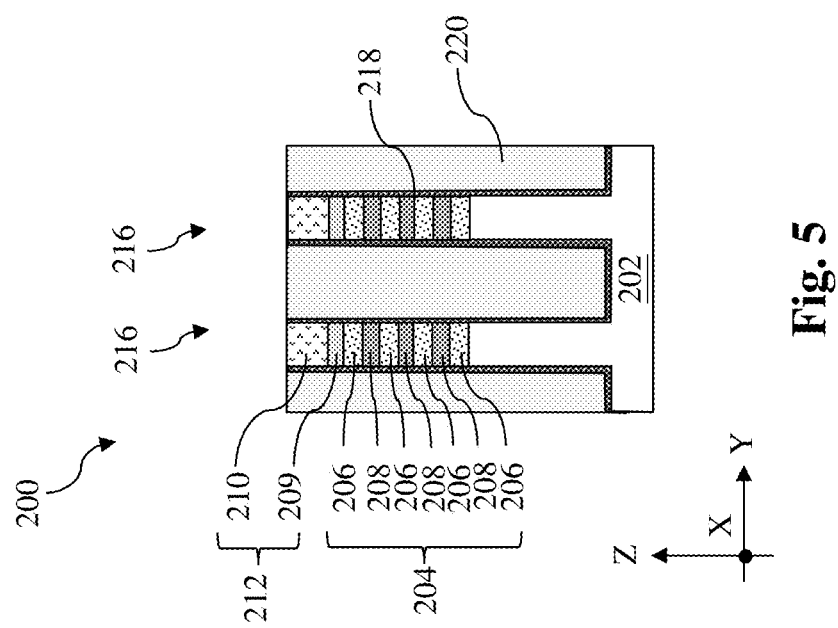
Figure 6:
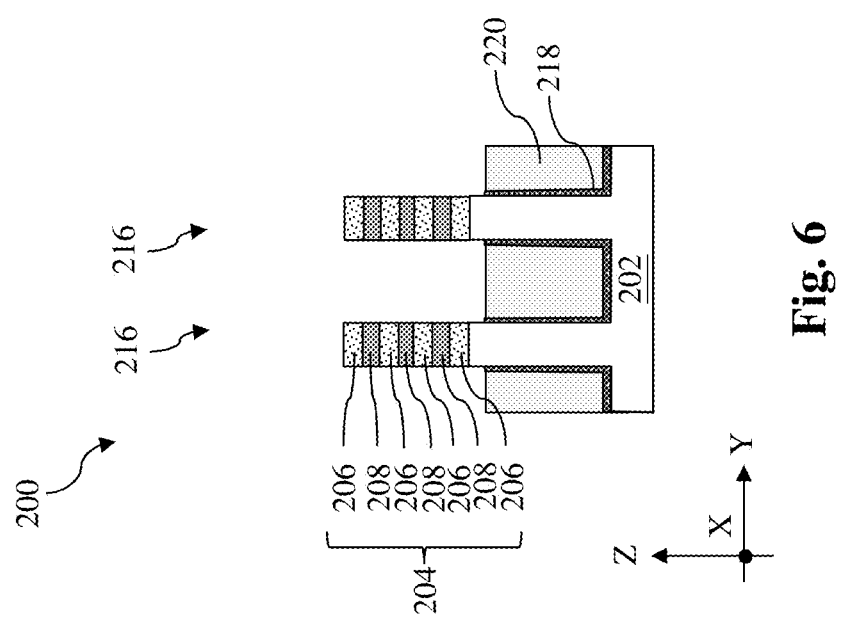

Referring to FIGS. 1, 5 and 6, method 100 includes a block 108 where an isolation feature 220 is formed. By way of example, in some embodiments, a dielectric material is first deposited over the workpiece 200, filling the trenches between neighboring fin-shaped structures 216. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric layer may be deposited by a spin-on coating process, a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process, as shown in FIG. 5. In FIG. 6, the planarized dielectric layer is further recessed or pulled-back by a dry etching process, a wet etching process, and/or a combination thereof to form the isolation feature 220. As shown in FIG. 6, the top portions of the fin-shaped structures 216, which are formed from the stack 204, are exposed while a portion of the bottom portions of the fin-shaped structures 216, which are formed from the substrate 202, is buried in the isolation feature 220. In some instances, the isolation feature 220 may be referred to as the shallow trench isolation (STI) feature 220.

As illustrated in FIG. 6, in some embodiments, the recessing at block 108 also removes the first silicon liner 218 from the portion of the fin-shaped structure 216 not covered by the isolation feature 220. In these embodiments, the sidewalls of the sacrificial layers 206 and the channel layers 208 are exposed.

Figure 7:
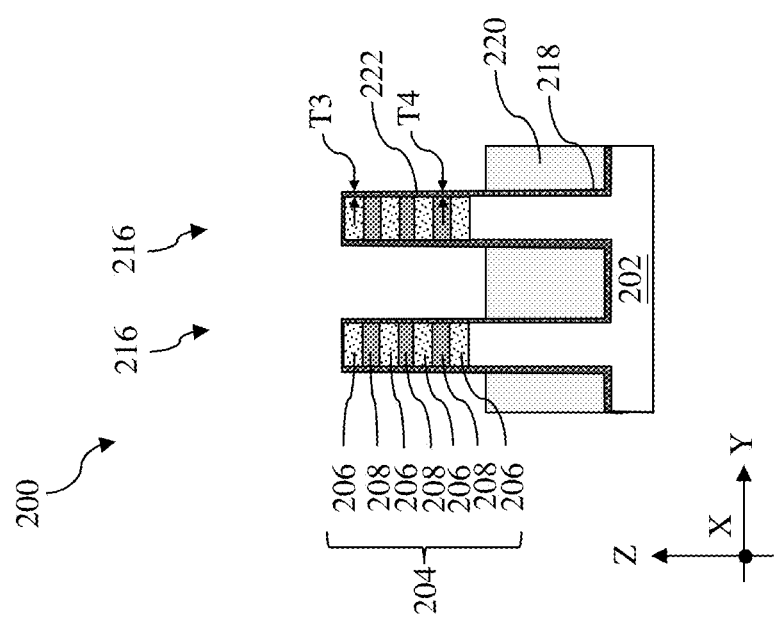
Figure 8:
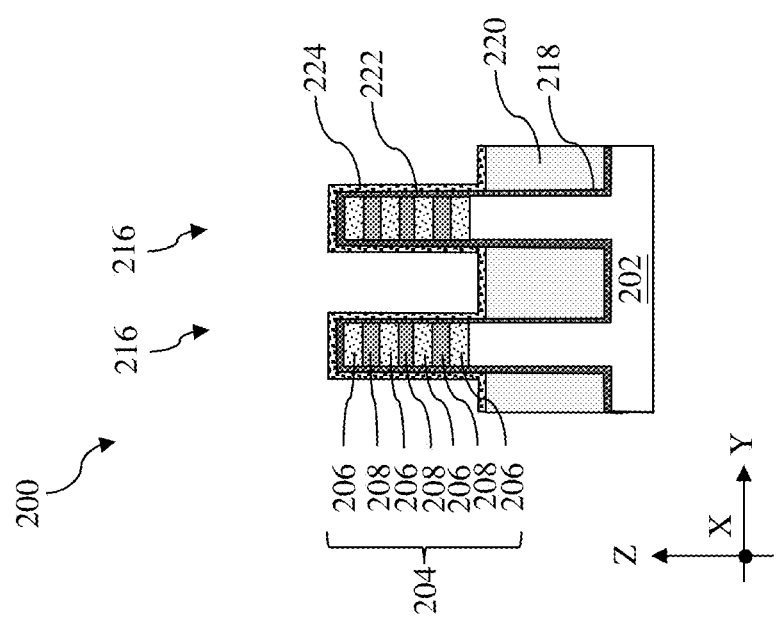
Figure 9:
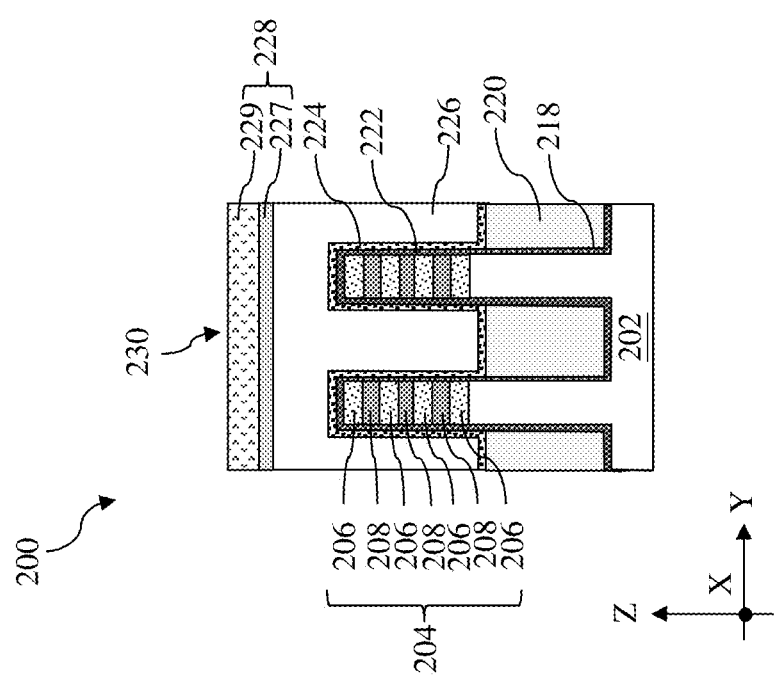

Referring to FIGS. 1 and 7, method 100 includes a block 110 where a second silicon liner 222 is formed over a portion of the fin-shaped structure 216 that extends above the isolation feature 220. Like the first silicon liner 218, the second silicon liner 222 may be deposited using an epitaxial deposition process, such as an MBE process, a VPE process, an UHV-CVD process, an MOCVD process, and/or other suitable epitaxial growth processes. In some embodiments represented in FIG. 7, the second silicon liner 222 may be epitaxially and selectively grown from semiconductor surfaces, such as surfaces of the sacrificial layers 206 and channel layers 208. In other embodiments not explicitly shown, the second silicon liner 222 may be epitaxially grown in a less selective setting on the workpiece 200, including on the surfaces of the sacrificial layers 206, the channel layers 208, and the isolation feature 220. In both cases, the second silicon liner 222 is deposited on the surfaces of the sacrificial layers 206 and the channel layers 208. In an example epitaxial deposition process, a silicon-containing precursor, such as mono-silane ($SiH_4$) or disilane ($Si_2H_6$) may be used as a silicon precursor. In implementations where mono-silane is used, the epitaxial deposition process may include a process temperature between about 480° C. and about 520° C., such as about 500° C. In implementations where disilane is used, the epitaxial deposition process may include a process temperature between about 360° C. and about 400° C., such as about 380° C.

In one embodiment, the second silicon liner 222 may be deposited at different rates on surfaces of channel layers 208 and sacrificial layers 206. In the depicted embodiments, the second silicon liner 222 deposits on sacrificial layers 206 at a greater rate than it does on the channel layers 208. As a result, the second silicon liner 222 may have a third thickness T3 on the sacrificial layers 206 and a fourth thickness T4 on the channel layers 208. The fourth thickness T4 is smaller than the third thickness T3. In some embodiments, the fourth thickness T4 is between about 0.4 nm and about 0.6 nm. As compared to the first silicon liner 218, the second silicon liner 222 has a smaller thickness. This comparison may be manifested by the comparison between the second thickness T2 and the fourth thickness T4. The second thickness T2, which may be between about 1.5 nm and about 2.0 nm, is greater than the fourth thickness T4, which may be between about 0.4 nm and about 0.6 nm. Although the exact mechanism resulting in the deposition rate difference is still being investigated, it is widely believed that differences in incubation time and lattice constant mismatch are likely the origin. Here, incubation refers to the probability of the precursor, such as mono-silane or disilane, sticks on the surface and lattice constant mismatch refers to the different lattice constants of silicon and germanium. It is hypothesized that the silicon-containing precursors may have higher probability to stick on surfaces of sacrificial layers 206 (formed of silicon germanium) or that the lattice mismatch may cause the second silicon liner 222 to have a more defective local crystalline structure near surfaces of the sacrificial layers 206. The higher probability of sticking (i.e., greater sticking coefficient) leads to a greater deposition rate and the more defective crystalline structure may lead to an increased volume due to presence of dislocations and voids. Either case may give an appearance of greater deposition rate on surfaces of the sacrificial layers 206.

Reference is made to FIG. 32. Even when the fin-shaped structure 216 has the wavy first sidewall profile 402, deposition of the second silicon liner 222 on the fin-shaped structure 216 at block 110 may result in different sidewall profiles. A second sidewall profile 404 represents the situation where the recesses 410 are incompletely compensated by the deposition of the second silicon liner 222 such that the recesses 410 become shallow recesses 420. A third sidewall profile 406 represents the situation where the recesses 410 are completely compensated by the deposition of the second silicon liner 222 such that the recesses 410 are smoothed out. A fourth sidewall profile 408 represents the situation where the recesses 410 are overly compensated by the deposition of the second silicon liner 222 such that ridges 430 are formed over the recesses 410. Referring to FIGS. 3 and 7, mathematically, the second sidewall profile 404 represents a situation where a sum of the first width W1 and twice the third thickness T3 (i.e., W1+2T3) is smaller than a sum of the second width W2 and twice the fourth thickness T4 (i.e., W2+2T4); the third sidewall profile 406 represents a situation where a sum of the first width W1 and twice the third thickness T3 (i.e., W1+2T3) is equal to a sum of the second width W2 and twice the fourth thickness T4 (i.e., W2+2T4); and the fourth sidewall profile 408 represents a situation where a sum of the first width W1 and twice the third thickness T3 (i.e., W1+2T3) is greater than a sum of the second width W2 and twice the fourth thickness T4 (i.e., W2+2T4).

Like the first silicon liner 218, the deposition of the second silicon liner 222 may be controlled to achieve the various sidewall profiles in FIG. 32 by applying different deposition process durations, different precursor species, and different process temperatures. For example, because disilane has a greater reactivity or sticking coefficient than mono-silane, use of disilane as the precursor at block 110 may enhance the difference in deposition rates of the second silicon liner 222 while use of mono-silane as the precursor at block 110 may reduce the difference in deposition rates of the second silicon liner 222. For another example, when the second silicon liner 222 is formed to a greater thickness, the difference in deposition rates may cause a greater thickness difference on surfaces of sacrificial layers 206 and channel layers 208. For yet another example, precursors for formation of the second silicon liner 222 generally have a greater reactivity at a higher temperature. When the process temperature is increased, the difference in deposition rates on surfaces of sacrificial layers 206 and channel layers 208 may be enhanced.

Figure 10:
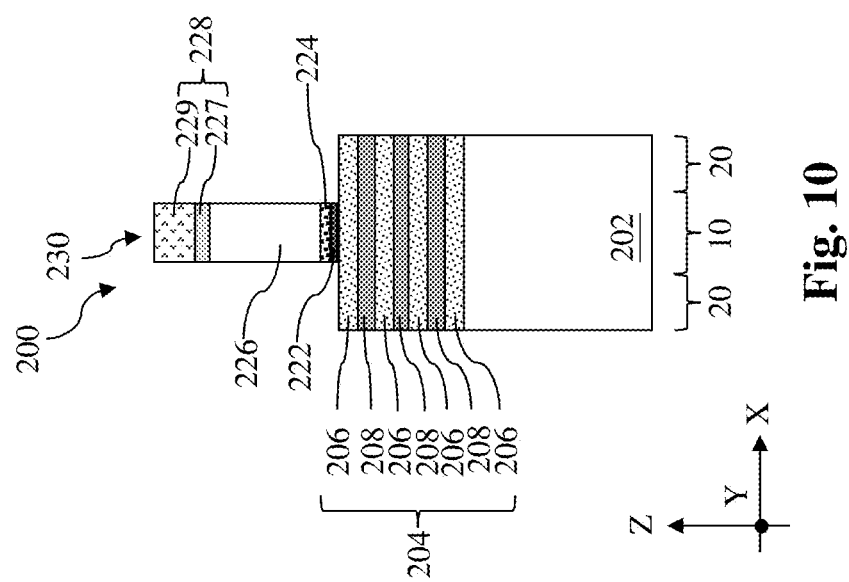

Referring to FIGS. 1, 8, 9, and 10, method 100 includes a block 112 where a dummy gate stack 230 is formed over a channel region 10 of the fin-shaped structure 216. In some embodiments represented in FIGS. 8 and 9, the dummy gate stack 230 includes a dummy dielectric layer 224 and a dummy electrode layer 226 and the dummy dielectric layer 224 is deposited directly on the second silicon liner 222. In those embodiments, a gate-top hard mask layer 228 that is used to pattern the dummy gate stack 230 may remain on top on the dummy electrode layer 226 to protect the dummy electrode layer 226. In the depicted embodiments, the gate-top hard mask layer 228 may be include a nitride hard mask layer 227 and an oxide hard mask layer 229 over the nitride hard mask layer 227. In some implementations, the dummy dielectric layer 224 may include silicon oxide, the dummy electrode layer 226 may include polysilicon, the nitride hard mask layer 227 may include silicon nitride or silicon oxynitride, and the oxide hard mask layer 229 may include silicon oxide. For ease of reference, the dummy gate stack 230 may be used to refer to not only the dummy dielectric layer 224, the dummy electrode layer 226, but also the gate-top hard mask layer 228 (including the nitride hard mask layer 227 and the oxide hard mask layer 229). The dummy gate stack 230 serves as a placeholder to undergo various processes and is to be removed and replaced by the functional gate structure at a later step. As shown in FIG. 10, the dummy gate stacks 230 are disposed over channel regions 10 of the fin-shaped structure 216. Each of the channel regions 10 is disposed between two source/drain regions 20 along the lengthwise direction of the fin-shaped structure 216, which is aligned with the X direction. Each of the dummy dielectric layer 224, the dummy electrode layer 226, and the gate-top hard mask layer 228 may be deposited using a CVD process, an ALD process, or a suitable deposition process. Similar to the fin-shaped structures 216, the dummy gate stacks 230 may be patterned using photolithography and etch processes.

In some embodiments represented in FIG. 10, after formation of the dummy gate stack 230, the dummy dielectric layer 224 is removed from the source/drain regions 20 of the fin-shaped structures 216. That is, the dummy dielectric layer 224 not covered by the dummy electrode layer 226 is removed. The removal process may include a wet etch, a dry etch, and/or a combination thereof. The etch process is chosen to selectively etch the dummy dielectric layer 224 without substantially etching the fin-shaped structure 216, the gate-top hard mask layer 228, and the dummy electrode layer 226.

Figure 11:
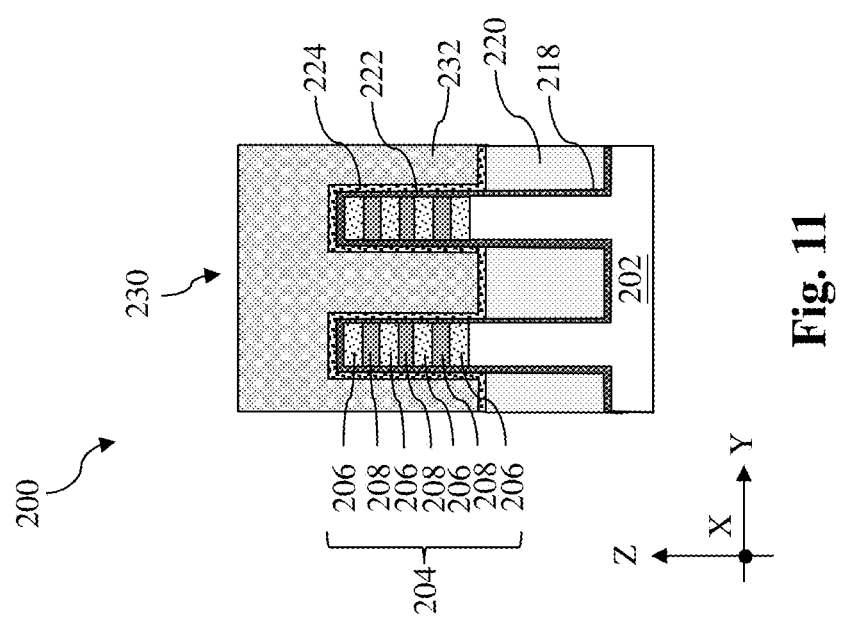
Figure 12:
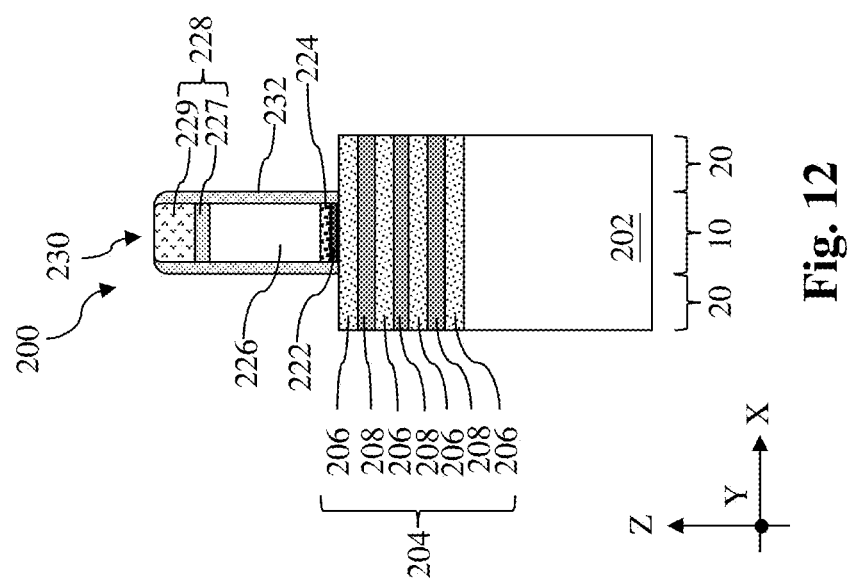

Referring to FIGS. 1, 11 and 12, method 100 includes a block 114 where a gate spacer layer 232 is deposited over the dummy gate stack 230. The gate spacer layer 232 may be a single layer or a multi-layer deposited conformally on the workpiece 200, including over the dummy gate stack 230. The term "conformally" may be used herein for ease of description of a layer having substantially uniform thickness over various regions. The gate spacer layer 232 may include silicon oxide, silicon oxycarbide, silicon carbonitride, silicon nitride, zirconium oxide, aluminum oxide, or a suitable dielectric material. The gate spacer layer 232 may be deposited over the dummy gate stack 230 using processes such as, CVD process, a subatmospheric CVD (SACVD) process, a flowable CVD process, an ALD process, a PVD process, or other suitable process. As shown in FIG. 12, the gate spacer layer 232 may be etched back in an anisotropic etch process to expose the source/drain regions 20. Portions of the gate spacer layer 232 directly over the dummy gate stack 230 may be completely removed by this anisotropic etch process while the gate spacer layer 233 remains on sidewalls of the dummy gate stack 230, as shown in FIG. 12.

Figure 13:
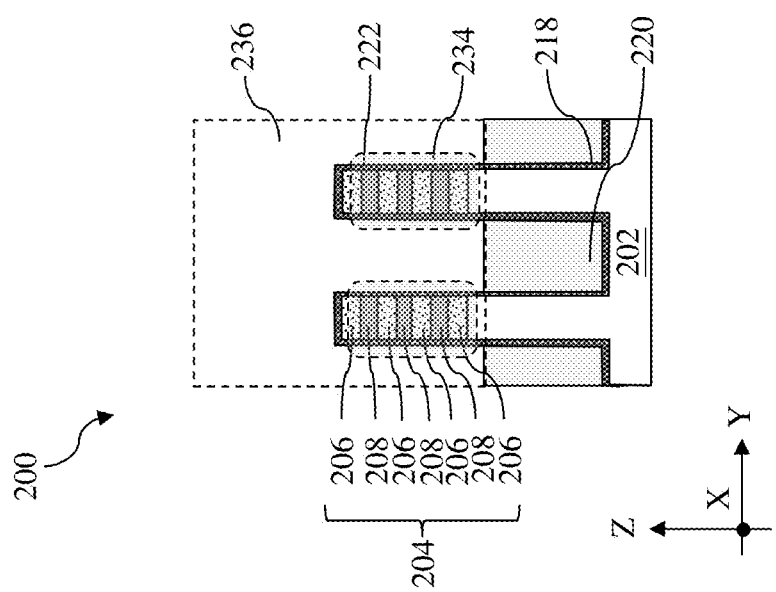

Referring to FIGS. 1 and 13, method 100 includes a block 116 where a source/drain feature 234 is formed in a source/drain region 20 adjacent to the channel region 10. While not explicitly shown, operations at block 116 include recessing the source/drain regions 20 to form source/drain recesses, selectively and partially recessing the sacrificial layers 206 to form inner spacer recesses, formation of inner spacer features in the inner spacer recesses, and deposition of the source/drain features 234 in the source/drain recesses. In some embodiments, the source/drain regions 20 of the fin-shaped structures 216 that are not covered by the dummy gate stack 230 and the gate spacer layer 232 are etched by a dry etch or a suitable etching process to form the source/drain recesses in the source/drain regions 20. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The source/drain regions 20 of the fin-shaped structure 216 are recessed to expose sidewalls of the sacrificial layers 206 and the channel layers 208 in the source/drain recesses. Thereafter, the sacrificial layers 206 exposed in the source/drain recesses are selectively and partially recessed along the X direction to form inner spacer recesses while the gate spacer layer 232 and the channel layers 208 are substantially unetched. In embodiment where the channel layers 208 consist essentially of Si and sacrificial layers 206 consist essentially of SiGe, the selective recess of the sacrificial layers 206 may include a SiGe oxidation process followed by a SiGe oxide removal. In those embodiments, the SiGe oxidation process may include use of ozone. In some embodiments, the selective recess may be a selective isotropic etching process (e.g., a selective dry etching process or a selective wet etching process), and the extent the sacrificial layers 206 are recessed is controlled by duration of the etching process. In some embodiments, the selective dry etching process may include use of one or more fluorine-based etchants, such as fluorine gas or hydrofluorocarbons. In some embodiments, the selective wet etching process may include a hydro fluoride (HF) or $NH_4OH$ etchant.

Inner spacer features are formed in the inner spacer recesses. In some embodiments, an inner spacer material layer is conformally deposited over the workpiece 200 and the deposited inner spacer material layer is etched back to form the inner spacer features. The inner spacer material layer may be a single layer or a multilayer. In some implementations, the inner spacer material layer may be deposited using CVD, PECVD, LPCVD, ALD or other suitable method. The inner spacer material layer may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. The deposited inner spacer material layer is then etched back to remove the inner spacer material layer from the sidewalls of the channel layers 208 to obtain the inner spacer features in the inner spacer recesses. The inner spacer material layer may also be removed from the top surfaces of dummy gate stack 230, the gate spacer layer 232, and the isolation features 220. In some embodiments, the composition of the inner spacer material layer is selected such that the inner spacer material layer may be selectively removed without substantially etching the gate spacer layer 232. In some implementations, the etch back operations may include use of hydrogen fluoride (HF), fluorine gas ($F_2$), hydrogen ($H_2$), ammonia ($NH_3$), nitrogen trifluoride ($NF_3$), or other fluorine-based etchants.

With the inner spacer features formed to separate the sacrificial layers 206 from the source/drain recess, the source/drain feature 234 is epitaxially deposited in the source/drain recess. It is noted that FIG. 13 is a cross-sectional view at the channel region 10, the source/drain features 234 formed in the source/drain region 20 is illustrated in dotted lines. The source/drain feature 234 may be deposited using an MBE process, a VPE process, an UHV-CVD process, an MOCVD process and may be may be doped in-situ. In embodiments represented in FIG. 13, the source/drain feature 234 may include silicon doped with an n-type dopant, such as phosphorus (P), or silicon germanium doped with a p-type dopant, such as boron (B). In some implementations, the deposition of the source/drain feature 234 is selective to semiconductor surfaces such that the source/drain feature 234 grows from exposed sidewalls of the channel layers 208 and the exposed surface of the substrate 202 (i.e., the bottom portion of the source/drain region 20 of the fin-shaped structure 216). To activate the dopants in the source/drain feature 234, block 116 may include an anneal process to anneal the source/drain feature 234. In some implementation, the anneal process may include a rapid thermal anneal (RTA) process, a laser spike anneal process, a flash anneal process, or a furnace anneal process. In some instances, the anneal process includes a peak anneal temperature between about 900° C. and about 1000° C.

Referring to FIGS. 1 and 13, method 100 includes a block 118 where the dummy gate stack 230 is removed. Operations at block 118 may include deposition of an interlayer dielectric (ILD) layer 236, a planarization process to expose the dummy electrode layer 226, removal of the dummy gate stack 230, and selective removal of the sacrificial layers 206 to release the channel layers 208 as channel members 208. Referring to FIG. 13, after formation of the source/drain features 234 in the source/drain region 20, the ILD layer 236 may be deposited over the workpiece 200 and may fill the rest of the source/drain recess. In some embodiments not explicitly shown in FIG. 13, a contact etch stop layer (CESL) may be disposed between the source/drain feature 234 and the ILD layer 236. The CESL may be deposited before the deposition of the ILD layer 236 and may include silicon nitride and silicon oxynitride. It is noted that because the FIG. 13 illustrates a cross-sectional view at the channel region 10, the ILD layer 236 in the source/drain region 20 is illustrated in dotted lines. The CESL may be formed by ALD, plasma-enhanced chemical vapor deposition (PECVD) process and/or other suitable deposition or oxidation processes. The ILD layer 236 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 236 may be deposited by a PECVD process or other suitable deposition technique. In some embodiments, after formation of the ILD layer 236, the workpiece 200 may be annealed to improve integrity of the ILD layer 236.

Referring still to FIG. 13, after the deposition of the CESL and the ILD layer 236, the workpiece 200 may be planarized by a planarization process to expose the dummy electrode layer 226 (shown in FIG. 12). For example, the planarization process may include a CMP process. At this point, the dummy gate stack 230 is separated from the ILD layer 236 by the gate spacer layer 232. Exposure of the dummy electrode layer 226 allows the removal of the dummy electrode layer 226 and the dummy dielectric layer 224 in the channel region 10. In some embodiments, the removal of the dummy electrode layer 226 and the dummy dielectric layer 224 results in a gate trench over the channel regions 10. The removal of the dummy electrode layer 226 and the dummy dielectric layer 224 may include one or more etching processes that are selective to the material in the dummy electrode layer 226 and the dummy dielectric layer 224. For example, the removal of the dummy electrode layer 226 and the dummy dielectric layer 224 may be performed using as a selective wet etch, a selective dry etch, or a combination thereof that is selective to the dummy electrode layer 226 and the dummy dielectric layer 224. After the selective removal of the dummy electrode layer 226 and the dummy dielectric layer 224, the second silicon liner 222 in the channel regions 10 are exposed in the gate trench.

Figure 14:
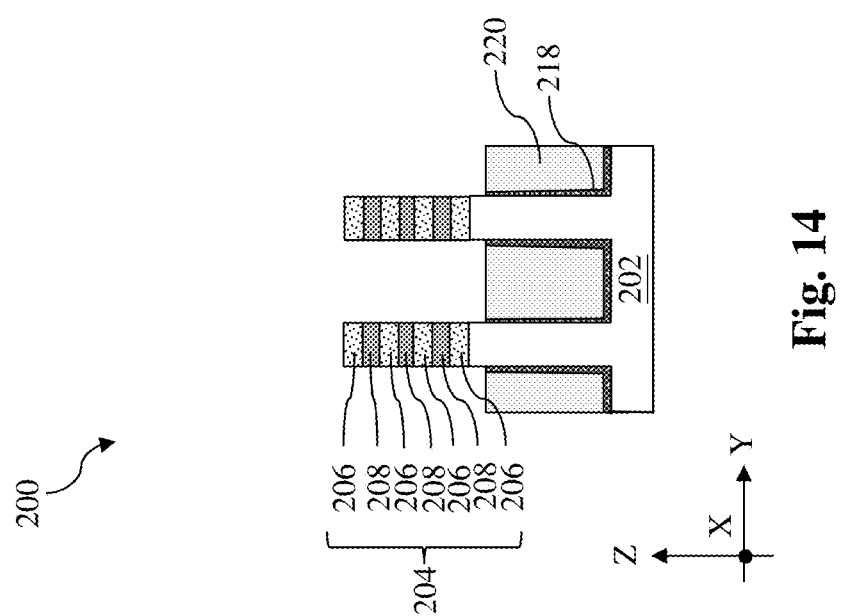

Referring to FIGS. 1, 13 and 14, method 100 includes a block 120 where the second silicon liner 222 is removed to expose the sacrificial layers 206 and the channel layers 208. In some embodiments, the selective wet etch or selective dry etch process at block 118 may be allowed to continue to remove the second silicon liner 222. In some alternative embodiments, the second silicon liner 222 is first oxidized and the oxidized form of the second silicon liner 222 may be selectively removed. In these alternative embodiments, an oxidizing agent, such as oxygen, ozone, water, or hydrogen peroxide, may be used in an oxidation process to transform the second silicon liner 222 into a silicon oxide layer. Then the silicon oxide layer may be selectively removed without substantially damaging the channel layers 208 and the sacrificial layer 206. In an example, the selective removal of the silicon oxide layer may include use of hydrogen fluoride and ammonia.

Figure 15:
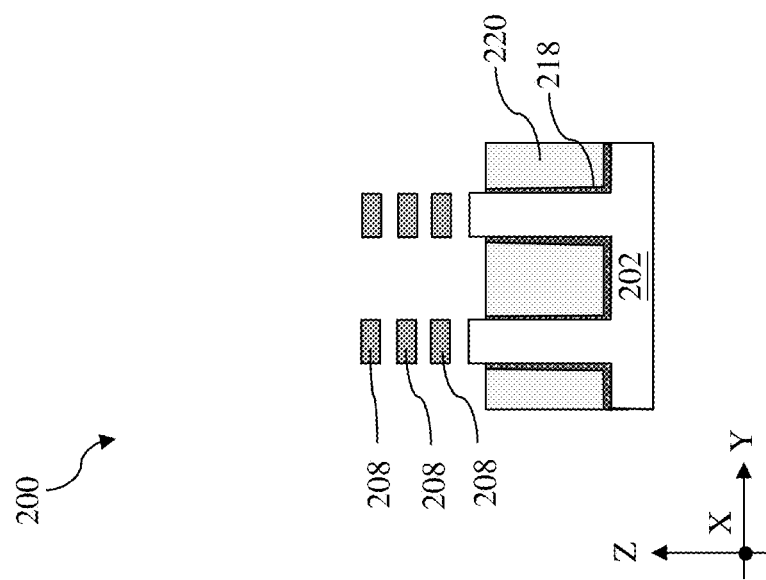

Referring to FIGS. 1 and 15, method 100 includes a block 122 where the sacrificial layers 206 in the channel region 10 are selectively removed to release the channel layers 208 as channel members 208. The selective removal of the sacrificial layers 206 may be implemented by selective dry etch, selective wet etch, or other selective etch processes. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by ozone clean and then SiGeOx is removed by an etchant such as $NH_4OH$.

Figure 16:
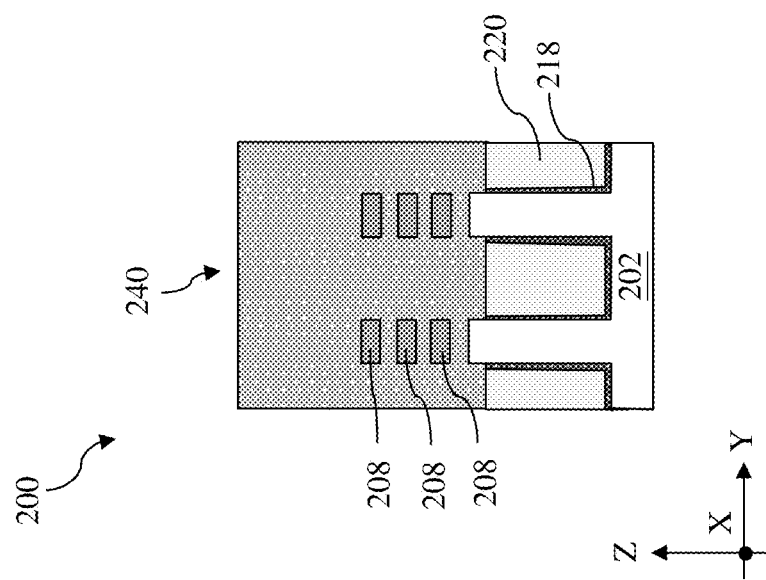
Figure 17:
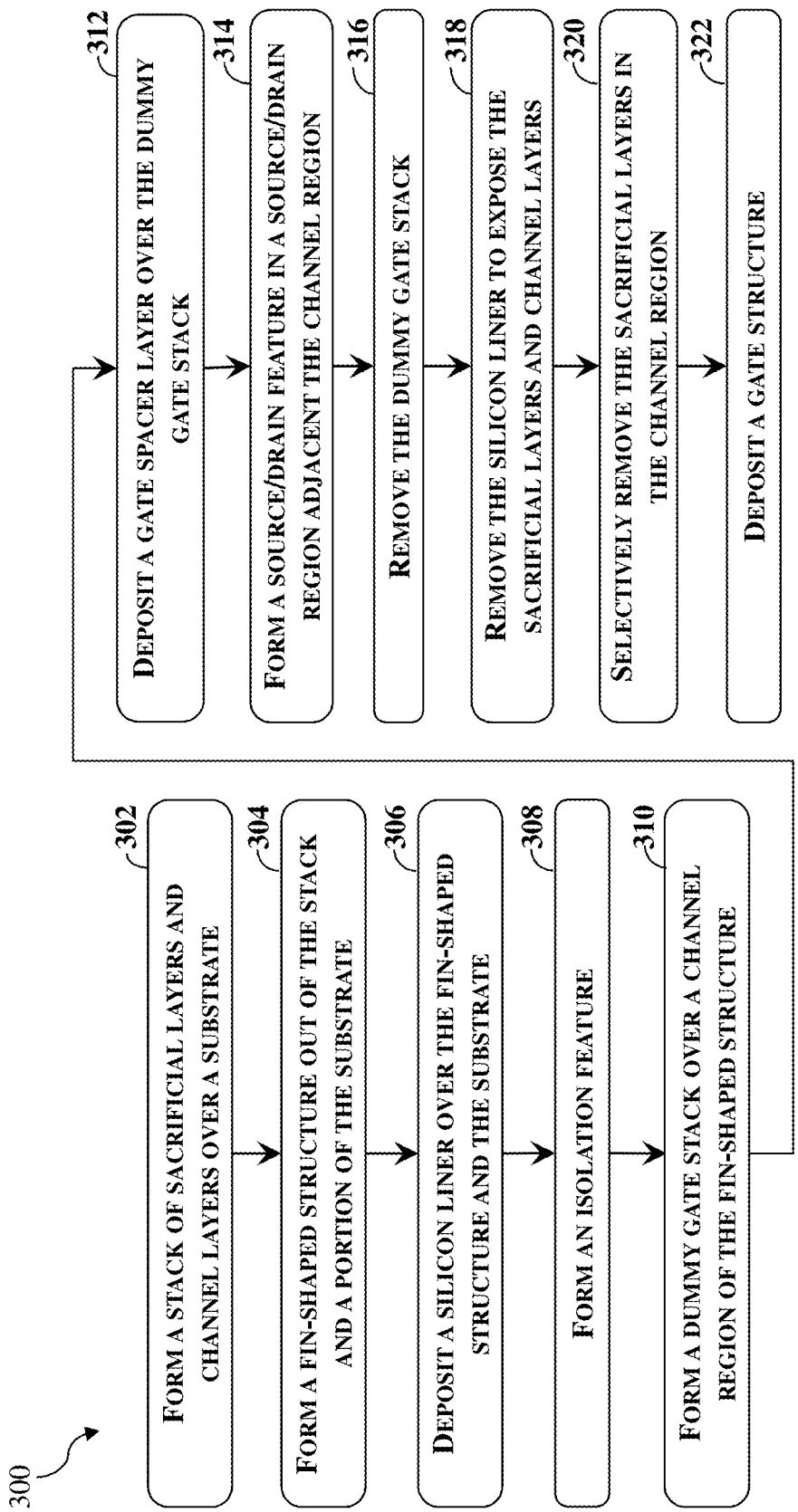
FIG. 17 is a flow chart of another method for fabricating a semiconductor device on a workpiece, according to aspects of the present disclosure.

Referring to FIGS. 1 and 16, method 100 includes a block 124 where the gate structure 240 is formed. The gate structure 240 wraps around each of the channel members 208, which are formed from the channel layers 208. The gate structure 240 may be a high-K metal gate structure. Here, a high-k dielectric material refers to a dielectric material with a dielectric constant greater than that of silicon dioxide, which is about 3.9. In various embodiments, the gate structure 240 includes an interfacial layer, a high-K gate dielectric layer formed over the interfacial layer, and/or a gate electrode layer formed over the high-K gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-K gate dielectric layer may include a high-K dielectric layer such as hafnium oxide. Alternatively, the high-K gate dielectric layer may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, (Ba,Sr)$TiO_3$ (BST), $Al_2O_3$, $Si_3N_4$, oxynitrides (SiON), combinations thereof, or other suitable material. The high-K gate dielectric layer may be formed by ALD, physical vapor deposition (PVD), CVD, oxidation, and/or other suitable methods.

The gate electrode layer may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof. In various embodiments, the gate electrode layer may be formed by ALD, PVD, CVD, e-beam evaporation, or other suitable process. In various embodiments, a CMP process may be performed to remove excessive metal from the workpiece 200, thereby providing substantially planar top surfaces of the gate structure 240.

Method 300 in FIG. 17 is now described below in conjunction with FIGS. 18-31, which are fragmentary cross-sectional views of the workpiece 200 at different stages of fabrication according to embodiments of method 300. For avoidance of doubts, throughout the present disclosure, similar features may share similar reference numerals. Unless otherwise specified, features having the same reference numeral may share substantially the same formation processes and materials.

Figure 18:
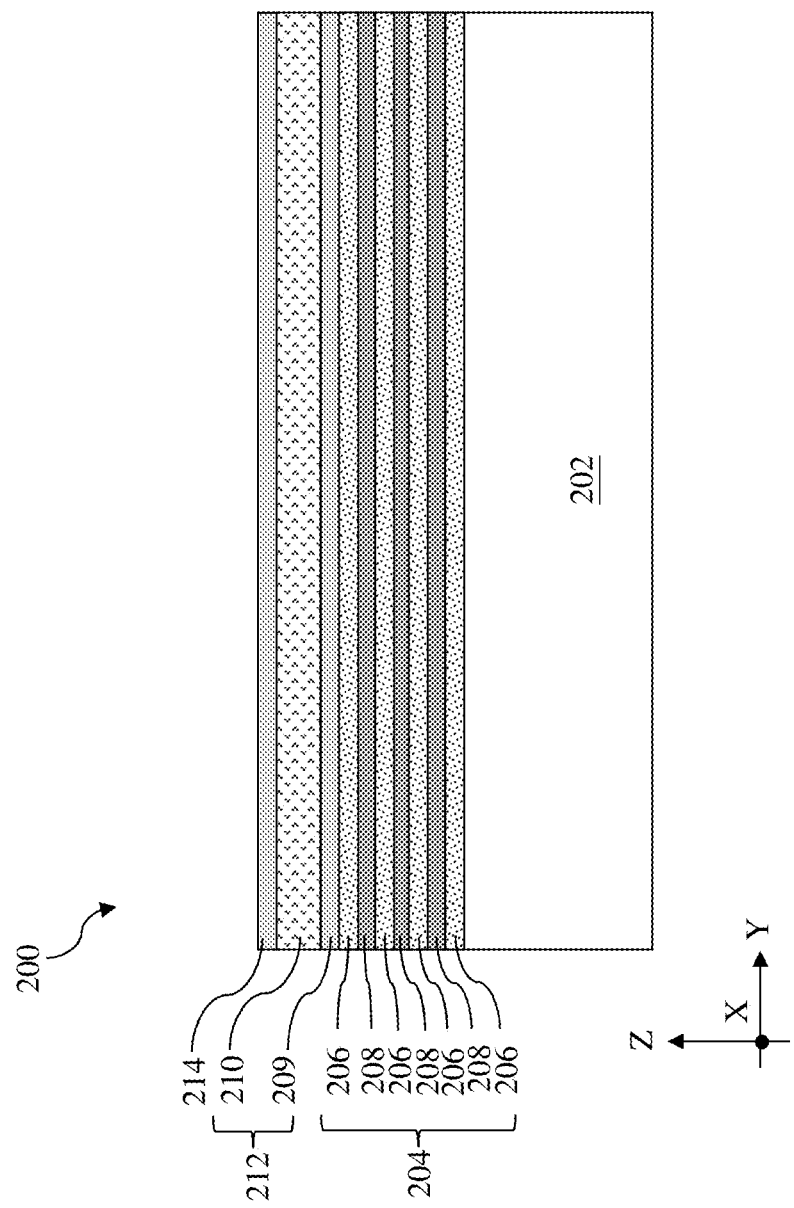
FIGS. 18-31 are fragmentary cross-sectional views of the workpiece at various steps of the method of FIG. 17, according to aspects of the present disclosure.

Referring to FIGS. 17 and 18, method 300 includes a block 302 where a stack 204 of sacrificial layers 206 and channel layers 208 is formed on a substrate 202. Because operations and device structures at block 302 are substantially similar to those at block 102 of method 100, detailed description of block 302 is omitted for brevity.

Figure 19:
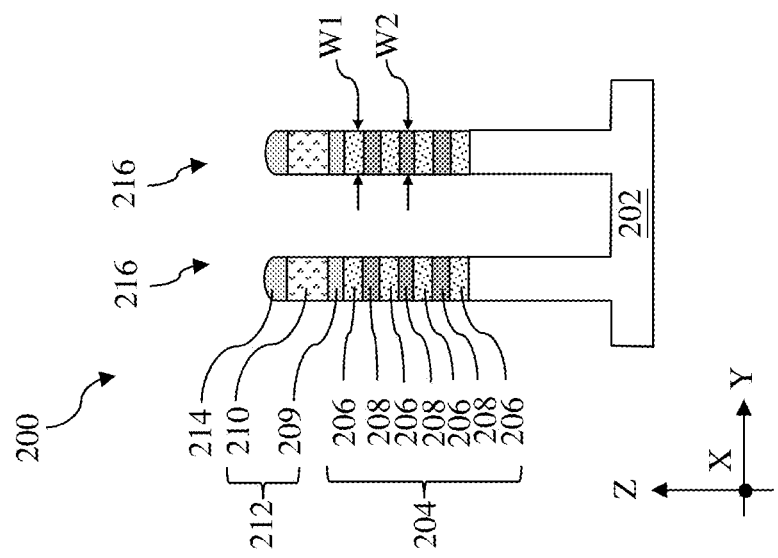

Referring to FIGS. 17, 18 and 19, method 300 includes a block 304 where a fin-shaped structure 216 is formed out of the stack 204 and a portion of the substrate 202. Because operations and device structures at block 304 are substantially similar to those at block 104 of method 100, detailed description of block 304 is omitted for brevity.

Figure 20:
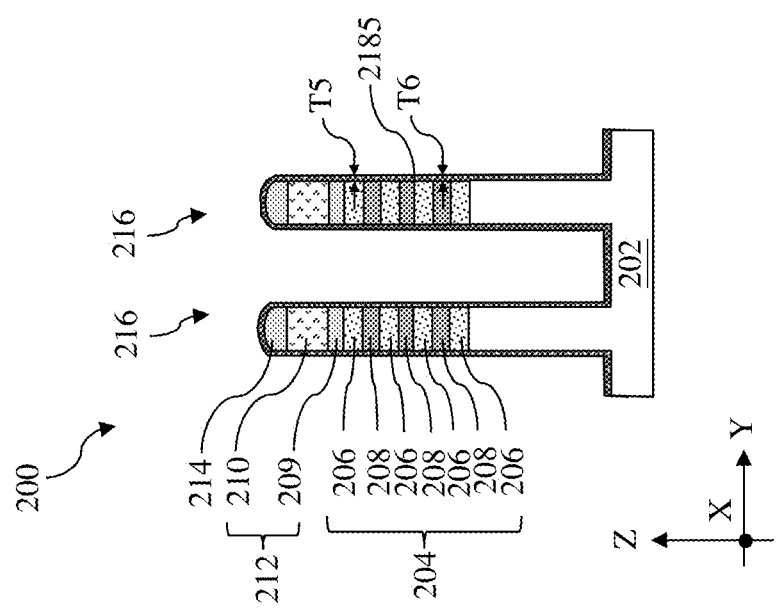

Referring to FIGS. 17 and 20, method 300 includes a block 306 where a silicon liner 2185 is deposited over the fin-shaped structure 216 and the substrate 202. The silicon liner 2185 may be deposited using an epitaxial deposition process, such as an MBE process, a VPE process, an UHV-CVD process, an MOCVD process, and/or other suitable epitaxial growth processes. In some embodiments represented in FIG. 20, the silicon liner 2185 may be epitaxially grown in a less selective setting on the workpiece 200, including on the surfaces of the substrate 202, sidewalls of the fin-shaped structures 216, sidewalls of the hard mask layer 212, sidewalls of the planarization layer 214, and top surfaces of the planarization layer 214. In other embodiments not explicitly shown, the silicon liner 2185 may be epitaxially and selectively grown from semiconductor surfaces, such as surfaces of the stack 204 and the substrate 202. In both cases, the silicon liner 2185 is deposited on the surfaces of the substrate 202, the sacrificial layers 206, and the channel layers 208. In an example epitaxial deposition process, a silicon-containing precursor, such as mono-silane ($SiH_4$) or disilane ($Si_2H_6$) may be used as a silicon precursor. In implementations where mono-silane is used, the epitaxial deposition process may include a process temperature between about 480° C. and about 520° C., such as about 500° C. In implementations where disilane is used, the epitaxial deposition process may include a process temperature between about 360° C. and about 400° C., such as about 380° C.

In one embodiment, the silicon liner 2185 may be deposited at different rates on surfaces of channel layers 208 and sacrificial layers 206. In the depicted embodiments, the silicon liner 2185 deposits on sacrificial layers 206 at a rate greater than it does on the channel layers 208. As a result, the silicon liner 2185 may have a fifth thickness T5 on the sacrificial layers 206 and a sixth thickness T6 on the channel layers 208. The sixth thickness T6 is smaller than the fifth thickness T5. In the depicted embodiments, the sixth thickness T6 is between about 1.9 nm and about 2.6 nm. The silicon liner 2185 is thicker than the first silicon liner 218 in method 100. For example, the fifth thickness T5 is greater than the first thickness T1 and the sixth thickness T6 is greater than the second thickness T2. Although the exact mechanism resulting in the deposition rate difference is still being investigated, it is widely believed that differences in incubation time and lattice constant mismatch are likely the origin. Here, incubation refers to the probability of the precursor, such as mono-silane or disilane, sticks on the surface and lattice constant mismatch refers to the different lattice constants of silicon and germanium. It is hypothesized that the silicon-containing precursors may have higher probability to stick on surfaces of sacrificial layers 206 (formed of silicon germanium) or that the lattice mismatch may cause the silicon liner 2185 to have a more defective crystalline structure locally near surfaces of the sacrificial layers 206. The higher probability of sticking (i.e., greater sticking coefficient) leads to a greater deposition rate and the more defective crystalline structure may lead to an increased volume due to presence of dislocations and voids. Either case may give an appearance of greater deposition rate on surfaces of the sacrificial layers 206.

Reference is made to FIG. 32. Even when the fin-shaped structure 216 has the wavy first sidewall profile 402, deposition of the silicon liner 2185 on the fin-shaped structure 216 at block 306 may result in different sidewall profiles. A second sidewall profile 404 represents the situation where the recesses 410 are incompletely compensated by the deposition of the silicon liner 2185 such that the recesses 410 become shallow recesses 420. A third sidewall profile 406 represents the situation where the recesses 410 are completely compensated by the deposition of the silicon liner 2185 such that the recesses 410 are smoothed out. A fourth sidewall profile 408 represents the situation where the recesses 410 are overly compensated by the deposition of the silicon liner 2185 such that ridges 430 are formed over the recesses 410. Referring to FIGS. 19 and 20, mathematically, the second sidewall profile 404 represents a situation where a sum of the first width W1 and twice the fifth thickness T5 (i.e., W1+2T5) is smaller than a sum of the second width W2 and twice the sixth thickness T6 (i.e., W2+2T6); the third sidewall profile 406 represents a situation where a sum of the first width W1 and twice the fifth thickness T5 (i.e., W1+2T5) is equal to a sum of the second width W2 and twice the sixth thickness T6 (i.e., W2+2T6); and the fourth sidewall profile 408 represents a situation where a sum of the first width W1 and twice the fifth thickness T5 (i.e., W1+2T5) is greater than a sum of the second width W2 and twice the sixth thickness T6 (i.e., W2+2T6).

According to the present disclosure, the deposition of the silicon liner 2185 may be controlled to achieve the various sidewall profiles in FIG. 32 by applying different deposition process durations, different precursor species, and different process temperatures. For example, because di-silane has a greater reactivity or sticking coefficient than mono-silane, use of disilane as the precursor at block 306 may enhance the difference in deposition rates of the silicon liner 2185 while use of mono-silane as the precursor at block 106 may reduce the difference in deposition rates of the silicon liner 2185. For another example, when the silicon liner 2185 is formed to a greater thickness, the difference in deposition rates may cause a greater thickness difference on surfaces of sacrificial layers 206 and channel layers 208. For yet another example, precursors for formation of the silicon liner 2185 generally have a greater reactivity at a higher temperature. When the process temperature is increased, the difference in deposition rates on surfaces of sacrificial layers 206 and channel layers 208 may be enhanced.

Figure 21:
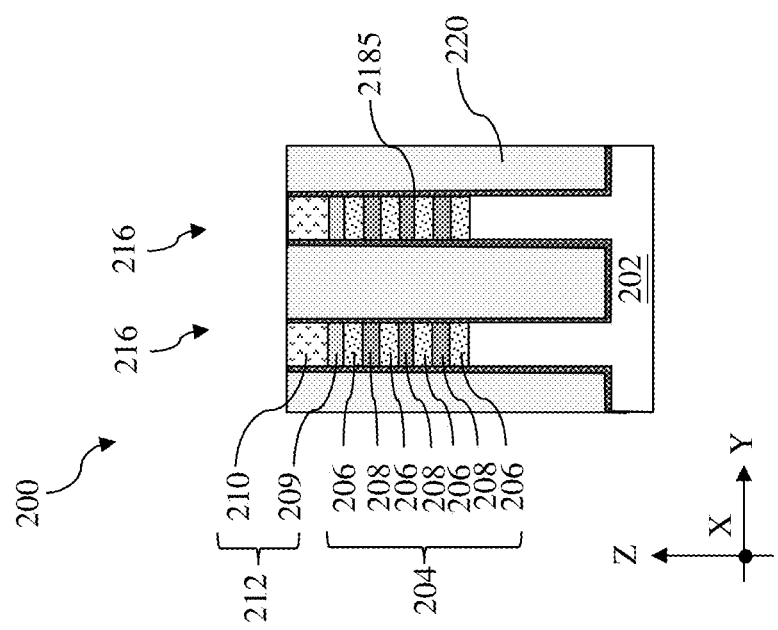
Figure 22:
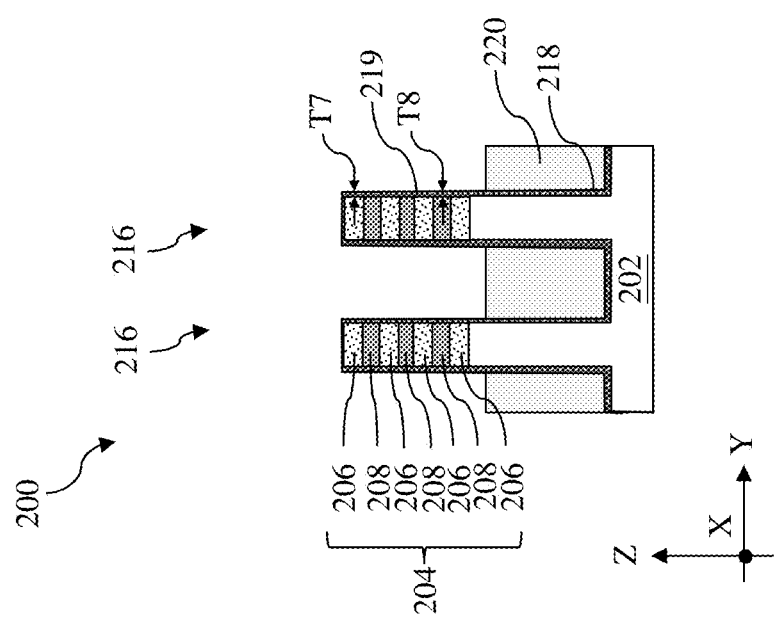
Figure 23:
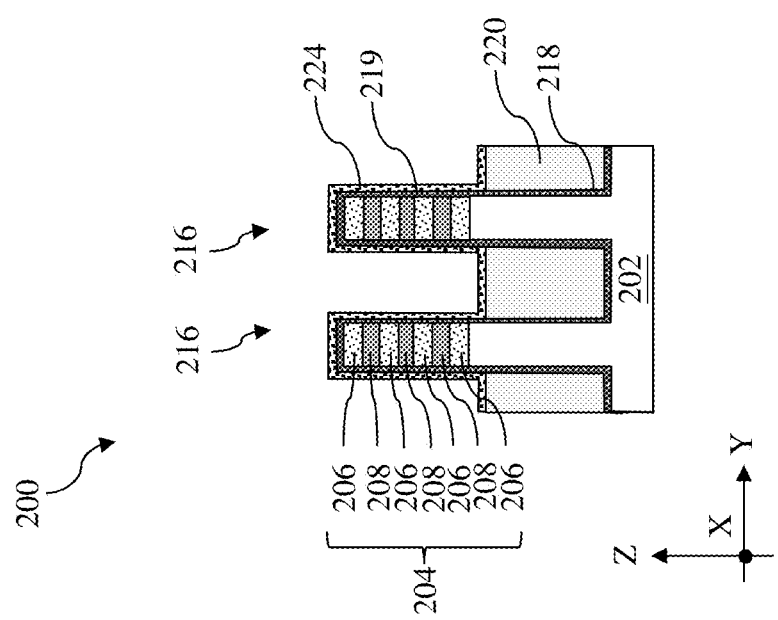
Figure 24:
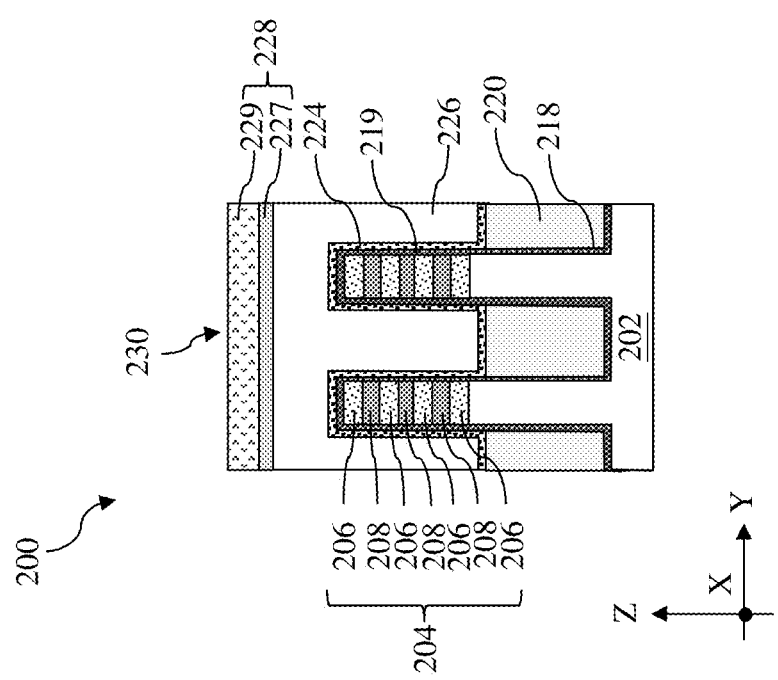

Referring to FIGS. 17, 21 and 22, method 300 includes a block 308 where an isolation feature 220 is formed. By way of example, in some embodiments, a dielectric material is first deposited over the workpiece 200, filling the trenches between neighboring fin-shaped structures 216. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric layer may be deposited by a spin-on coating process, a CVD process, a subatmospheric CVD (SACVD) process, a flowable CVD process, an ALD process, a physical vapor deposition (PVD) process, and/or other suitable process. The deposited dielectric material is then thinned and planarized, for example by a chemical mechanical polishing (CMP) process, as shown in FIG. 20. In FIG. 21, the planarized dielectric layer is further recessed or pulled-back by a dry etching process, a wet etching process, and/or a combination thereof to form the isolation feature 220. As shown in FIG. 21, the recessing of the dielectric layer may also reduce the thickness of the silicon liner 2185 on the portion of the fin-shaped structure 216 that is not covered by the isolation feature 220. For ease of reference, the silicon liner 2185 that is thinned during the recessing may be referred to as recessed silicon liner 219. As illustrated in FIG. 21, the recessed silicon liner 219 has a seventh thickness T7 on the sacrificial layers 206 and an eighth thickness T8 on the channel layers 208. In some examples, the seventh thickness T7 may be similar to the third thickness T3 and the eighth thickness T8 may be similar to the fourth thickness T4. In some instances, the isolation feature 220 may be referred to as the shallow trench isolation (STI) feature 220.

Figure 25:
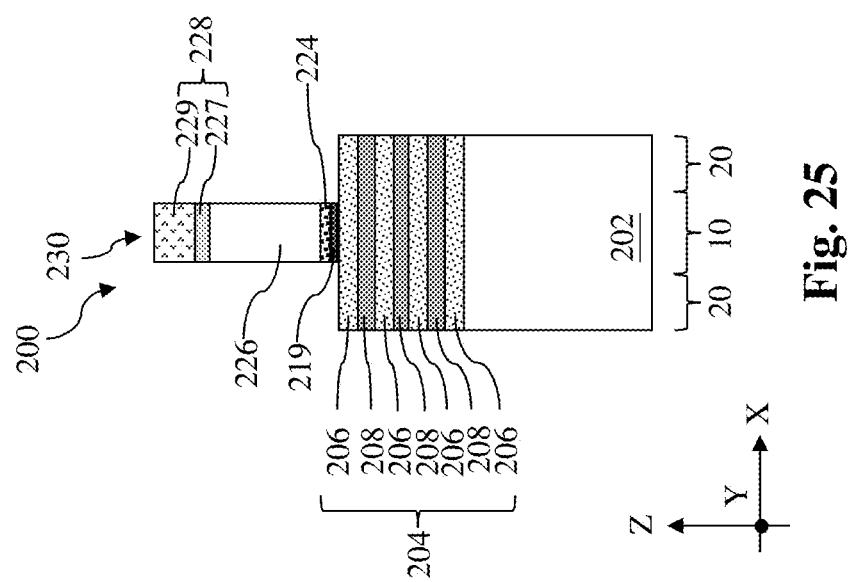

Referring to FIGS. 17, 23, 24, and 25, method 300 includes a block 310 where a dummy gate stack 230 is formed over a channel region 10 of the fin-shaped structure 216. In some embodiments represented in FIGS. 23 and 24, the dummy gate stack 230 includes a dummy dielectric layer 224 and a dummy electrode layer 226 and the dummy dielectric layer 224 is deposited directly on the recessed silicon liner 219. In those embodiments, a gate-top hard mask layer 228 that is used to pattern the dummy gate stack 230 may remain on top on the dummy electrode layer 226 to protect the dummy electrode layer 226. In the depicted embodiments, the gate-top hard mask layer 228 may be include a nitride hard mask layer 227 and an oxide hard mask layer 229 over the nitride hard mask layer 227. In some implementations, the dummy dielectric layer 224 may include silicon oxide, the dummy electrode layer 226 may include polysilicon, the nitride hard mask layer 227 may include silicon nitride or silicon oxynitride, and the oxide hard mask layer 229 may include silicon oxide. For ease of reference, the dummy gate stack 230 may be used to refer to not only the dummy dielectric layer 224, the dummy electrode layer 226, but also the gate-top hard mask layer 228 (including the nitride hard mask layer 227 and the oxide hard mask layer 229). The dummy gate stack 230 serves as a placeholder to undergo various processes and is to be removed and replaced by the functional gate structure at a later step. As shown in FIG. 25, the dummy gate stacks 230 are disposed over channel regions 10 of the fin-shaped structure 216. Each of the channel regions 10 is disposed between two source/drain regions 20 along the lengthwise direction of the fin-shaped structure 216, which is aligned with the X direction. Each of the dummy dielectric layer 224, the dummy electrode layer 226, and the gate-top hard mask layer 228 may be deposited using a CVD process, an ALD process, or a suitable deposition process. Similar to the fin-shaped structures 216, the dummy gate stacks 230 may be patterned using photolithography and etch processes.

In some embodiments represented in FIG. 25, after formation of the dummy gate stack 230, the dummy dielectric layer 224 is removed from the source/drain regions 20 of the fin-shaped structures 216. That is, the dummy dielectric layer 224 not covered by the dummy electrode layer 226 is removed. The removal process may include a wet etch, a dry etch, and/or a combination thereof. The etch process is chosen to selectively etch the dummy dielectric layer 224 without substantially etching the fin-shaped structure 216, the gate-top hard mask layer 228, and the dummy electrode layer 226.

Figure 26:
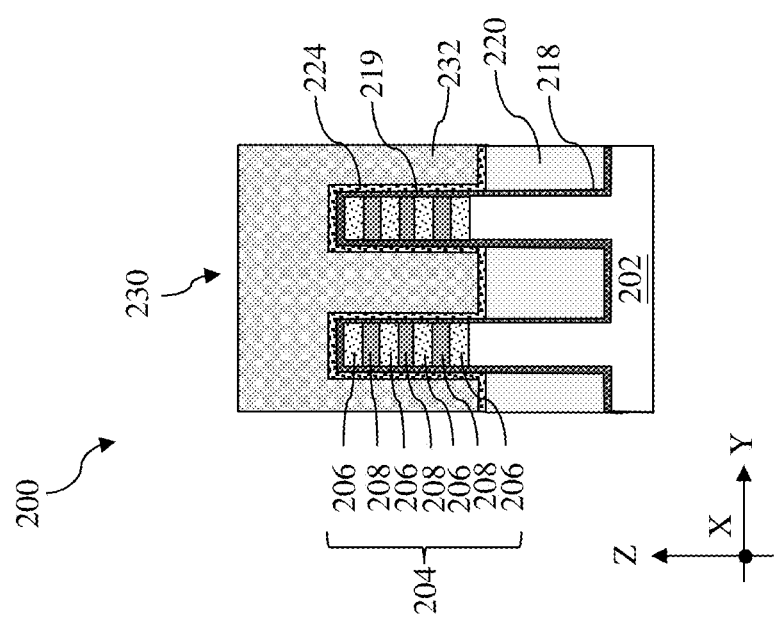
Figure 27:
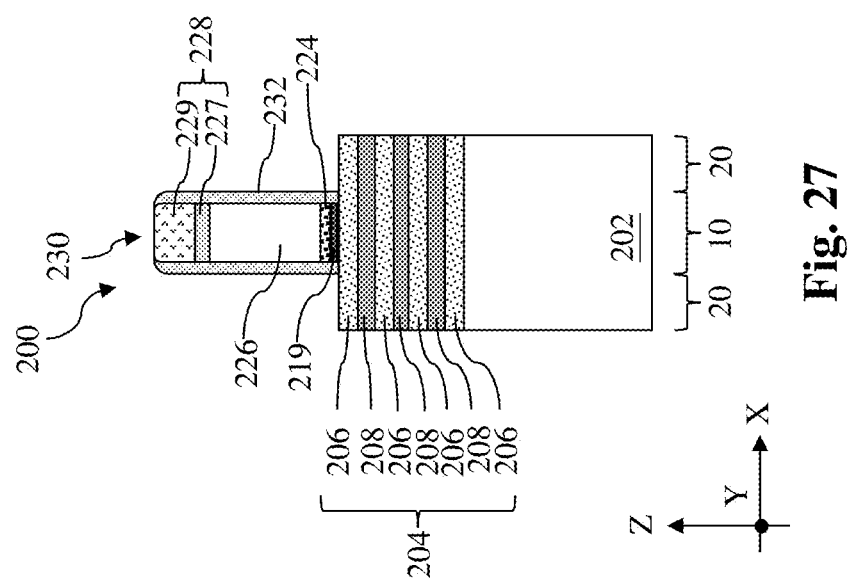

Referring to FIGS. 17, 26 and 27, method 300 includes a block 312 where a gate spacer layer 232 is deposited over the dummy gate stack 230. Because operations and device structures at block 312 are substantially similar to those at block 114 of method 100, detailed description of block 312 is omitted for brevity.

Figure 28:
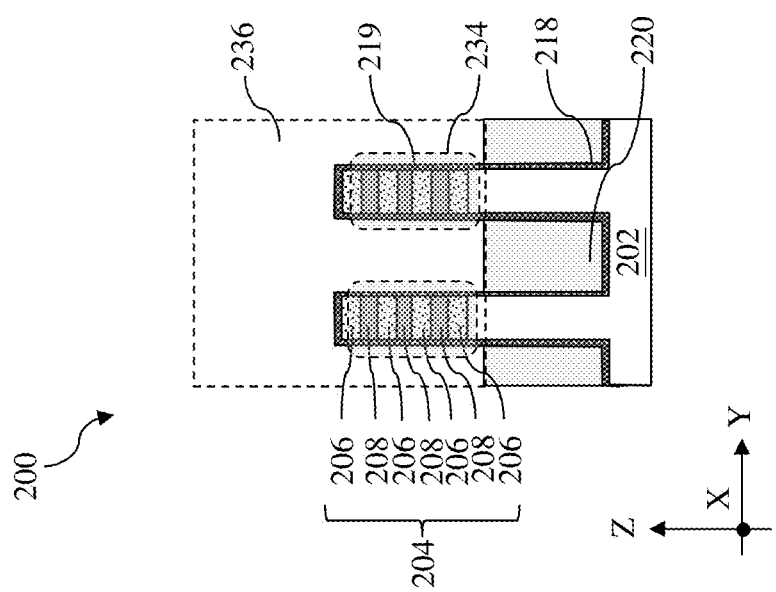

Referring to FIGS. 17 and 28, method 300 includes a block 314 where a source/drain feature 234 is formed in a source/drain region 20 adjacent to the channel region 10. Because operations and device structures at block 314 are substantially similar to those at block 116 of method 100, detailed description of block 314 is omitted for brevity.

Referring to FIGS. 17 and 28, method 300 includes a block 316 where the dummy gate stack 230 is removed. Because operations and device structures at block 316 are substantially similar to those at block 118 of method 100, detailed description of block 316 is omitted for brevity.

Figure 29:
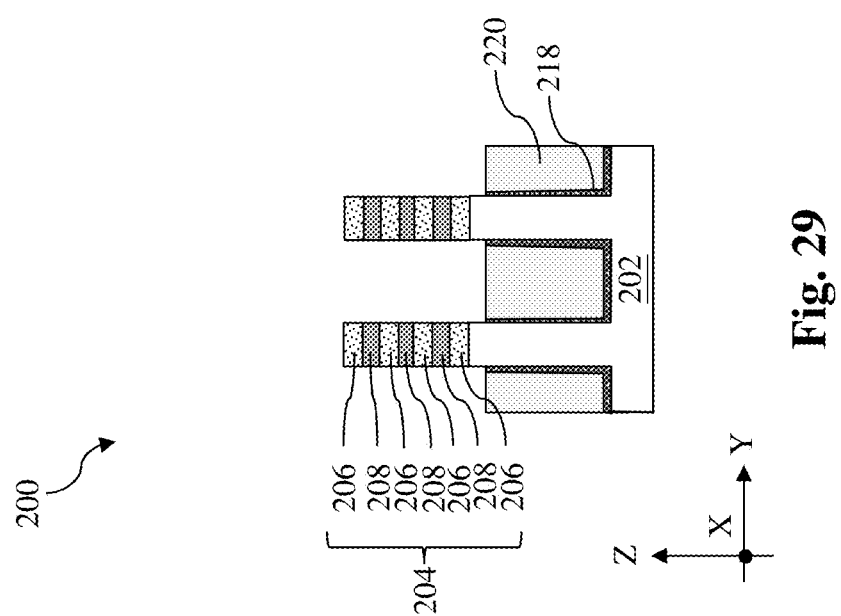

Referring to FIGS. 17, 28 and 29, method 300 includes a block 318 where the recessed silicon liner 219 is removed to expose the sacrificial layers 206 and the channel layers 208. In some embodiments, the selective wet etch or selective dry etch process at block 316 may be allowed to continue to remove the recessed silicon liner 219 at block 318. In some alternative embodiments, the recessed silicon liner 219 is first oxidized and the oxidized form of the recessed silicon liner 219 may be selectively removed. In these alternative embodiments, an oxidizing agent, such as oxygen, ozone, water, or hydrogen peroxide, may be used in an oxidation process to transform the recessed silicon liner 219 into a silicon oxide layer. Then the silicon oxide layer may be selectively removed without substantially damaging the channel layers 208 and the sacrificial layer 206. In an example, the selective removal of the silicon oxide layer may include use of hydrogen fluoride and ammonia.

Figure 30:
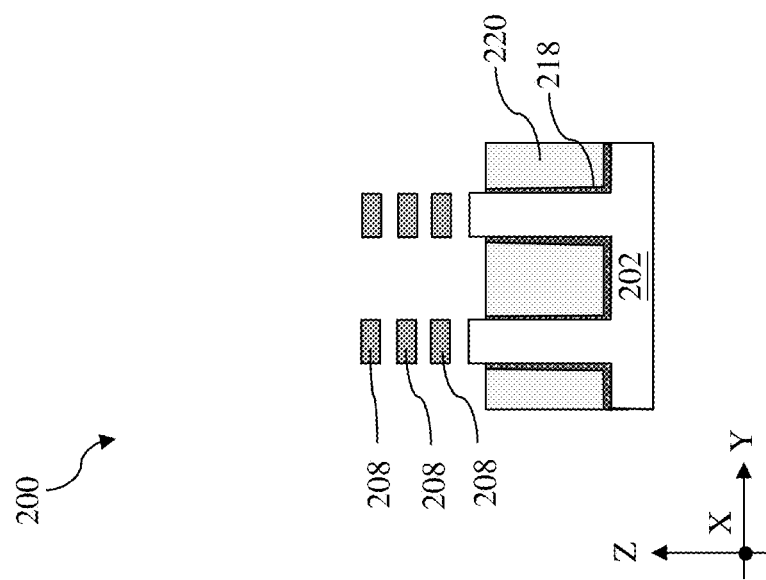

Referring to FIGS. 17 and 30, method 300 includes a block 320 where the sacrificial layers 206 in the channel region 10 are selectively removed to release the channel layers 208 as channel members 208. Because operations and device structures at block 320 are substantially similar to those at block 122 of method 100, detailed description of block 320 is omitted for brevity.

Figure 31:
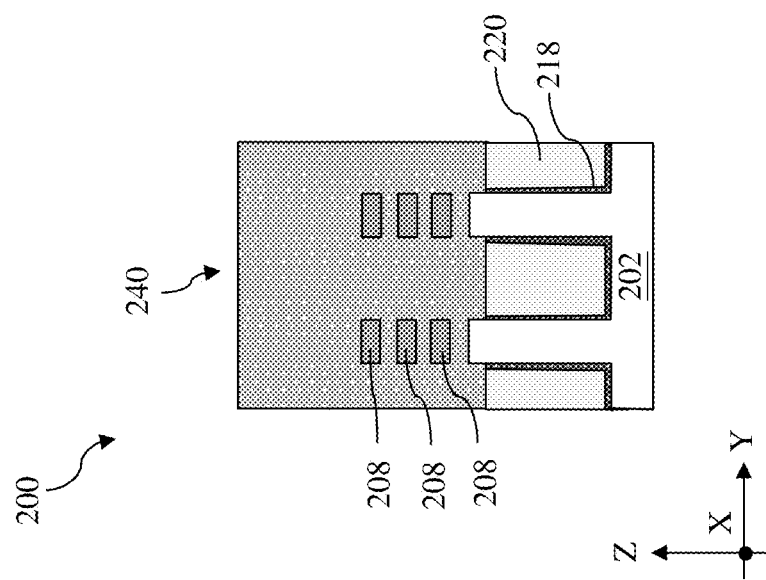

Referring to FIGS. 17 and 31, method 300 includes a block 322 where the gate structure 240 is formed. Because operations and device structures at block 322 are substantially similar to those at block 124 of method 100, detailed description of block 322 is omitted for brevity.

Methods of the present disclosure provide advantages. For example, the present disclosure provides methods for rectifying the wavy sidewall profiles of the fin-shaped structures. After the formation of the fin-shaped structure, a method according to an embodiment epitaxially deposits a first silicon liner on the fin-shaped structure. It has been observed that depending on the process parameters and precursors, the first silicon liner may have a greater thickness on silicon germanium surfaces and a smaller thickness on silicon surfaces. The first silicon liner may therefore compensate for the recesses in the sacrificial layers and rectify the wavy sidewall profile. In instances where the first silicon liner is removed during formation of isolation features among fin-shaped structures, a second silicon liner may be epitaxially deposited on the fin-shaped structure. A dummy gate stack, including a dummy dielectric layer and a dummy electrode layer, is formed on either the first silicon liner or the second silicon liner, as the case may be. When the dummy gate stack is removed, a separate removal process may be needed to remove the remaining first silicon liner or the second silicon liner in the channel region. By rectifying the sidewall profile of the fin-shaped structure, methods of the present disclosure facilitate complete removal of the sacrificial layers and reduces the risk of damaging the source/drain features.

The present disclosure provides embodiments of methods of fabricating semiconductor devices. In one embodiment, a method is provided. The method includes forming, on a substrate, a first fin-shaped structure and a second fin-shaped structure each having a plurality of channel layers interleaved by a plurality of sacrificial layers, epitaxially depositing a first silicon liner over the first fin-shaped structure and the second fin-shaped structure, depositing a dielectric layer over the substrate, the first fin-shaped structure and the second fin-shaped structure, etching back the dielectric layer to form an isolation feature between the first fin-shaped structure and the second fin-shaped structure such that a top portion of the first fin-shaped structure and a top portion of the second fin-shaped structure extend above the isolation feature, wherein the etching back removes the first silicon liner over the top portion of the first fin-shaped structure and the top portion of the second fin-shaped structure to expose sidewalls of the plurality of channel layers and the plurality of sacrificial layers, and epitaxially depositing a second silicon liner over the exposed sidewalls of the plurality of channel layers and the plurality of sacrificial layers.

In some embodiments, the first silicon liner includes a first thickness and the second silicon liner includes a second thickness smaller than the first thickness. In some embodiments, the first thickness is between about 1.5 nm and about 2.0 nm and the second thickness is between about 0.4 nm and about 0.6 nm. In some implementations, the epitaxially depositing of the first silicon liner includes use of disilane as a precursor and a process temperature between 360° C. and about 400° C. In some implementations, the method may further include depositing a dummy gate stack over a channel region of the fin-shaped structure, wherein the dummy gate stack is disposed on the second silicon liner, depositing a gate spacer layer over the dummy gate stack, recessing a source/drain region of the fin-shaped structure to form a source/drain recess, forming a source/drain feature in the source/drain recess, and depositing an interlayer dielectric layer over the source/drain feature. In some instances, the method may further include removing the dummy gate stack, removing the second silicon liner over the top portion of the first fin-shaped structure and the top portion of the second fin-shaped structure to expose sidewalls of the plurality of channel layers and the plurality of sacrificial layers, selectively removing the plurality of sacrificial layers to release the plurality of channel layers as a plurality of channel members, and forming a gate structure to surround each of the plurality of channel members. In some embodiments, the removing of the second silicon liner includes converting the second silicon liner into a silicon oxide layer and selectively removing the silicon oxide layer. In some instances, the selectively removing of the silicon oxide layer includes use of hydrogen fluoride (HF) and ammonia ($NH_3$).

In another embodiment, a method is provided. The method includes forming, on a substrate, a first fin-shaped structure and a second fin-shaped structure each including a plurality of channel layers interleaved by a plurality of sacrificial layers, epitaxially depositing a silicon liner of a first thickness over the first fin-shaped structure and the second fin-shaped structure, depositing a dielectric layer over the substrate, the first fin-shaped structure and the second fin-shaped structure, and etching back the dielectric layer to form an isolation feature between the first fin-shaped structure and the second fin-shaped structure such that a top portion of the first fin-shaped structure and a top portion of the second fin-shaped structure extend above the isolation feature, wherein the etching back reduces the first thickness of the silicon liner over the top portion of the first fin-shaped structure and the top portion of the second fin-shaped structure to a second thickness smaller than the first thickness.

In some embodiments, the first thickness is between about 1.9 nm and about 2.6 nm and the second thickness is between about 0.4 and about 0.6. In some implementations, the epitaxially depositing of the silicon liner includes di-silane as a precursor and a process temperature between 360° C. and about 400° C. In some embodiments, the method may further include depositing a dummy dielectric layer on the silicon liner over channel regions of the first fin-shaped structure and the second fin-shaped structure, depositing a dummy electrode layer over the dummy dielectric layer, depositing a gate spacer layer over the dummy electrode layer, recessing source/drain regions of the first fin-shaped structure and the second fin-shaped structure to form source/drain recesses, forming source/drain features in the source/drain recesses, and depositing an interlayer dielectric layer over the source/drain features. In some instances, the method may further include removing the dummy electrode layer and the dummy dielectric layer, removing the silicon liner over the top portion of the first fin-shaped structure and the top portion of the second fin-shaped structure to expose sidewalls of the plurality of channel layers and the plurality of sacrificial layers, selectively removing the plurality of sacrificial layers to release the plurality of channel layers as a plurality of channel members, and forming a gate structure to surround each of the plurality of channel members. In some implementations, the removing of the silicon liner includes converting the silicon liner into a silicon oxide layer and selectively removing the silicon oxide layer. In some instances, the selectively removing of the silicon oxide layer includes use of hydrogen fluoride (HF) and ammonia ($NH_3$).

In still another embodiment, a method is provided. The method includes depositing alternatingly a plurality of sacrificial layers and a plurality of channel layers on a substrate such that the plurality of sacrificial layers are interleaved by the plurality of channel layers, etching the plurality of sacrificial layers, the plurality of channel layers, and the substrate to form a fin-shaped structure, wherein each of the plurality of sacrificial layers in the fin-shaped structure has a first width and each of the plurality of channel layers in the fin-shaped structure has a second width greater than the first width, and epitaxially depositing a silicon liner on the fin-shaped structure, wherein the silicon liner has a first thickness measured from sidewalls of the plurality of sacrificial layers and a second thickness measured from sidewalls of the plurality of sacrificial layers, and wherein a sum of the first width and twice the first thickness is substantially equal to a sum of the second width and twice the second thickness.

In some embodiments, the plurality of sacrificial layers consist essentially of silicon germanium and the plurality of channel layers consist essentially of silicon. In some implementations, the etching includes a dry etch process. In some embodiments, the method may further include depositing a dummy dielectric layer directly on the silicon liner over a channel region of the fin-shaped structure, depositing a dummy electrode layer over the dummy dielectric layer, depositing a gate spacer layer over the dummy electrode layer, recessing a source/drain region of the fin-shaped structure to form a source/drain recess, forming a source/drain feature in the source/drain recess, and depositing an interlayer dielectric layer over the source/drain feature. In some instances, the method may further include removing the dummy electrode layer and the dummy dielectric layer to expose the silicon liner over the channel region of the fin-shaped structure, removing the silicon liner over the channel region of the fin-shaped structure to expose sidewalls of the plurality of channel layers and the plurality of sacrificial layers, selectively removing the plurality of sacrificial layers to release the plurality of channel layers as a plurality of channel members, and forming a gate structure to surround each of the plurality of channel members.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
forming, on a substrate, a first fin-shaped structure and a second fin-shaped structure each comprising a plurality of channel layers interleaved by a plurality of sacrificial layers;
epitaxially depositing a first silicon liner over the first fin-shaped structure and the second fin-shaped structure;

depositing a dielectric layer over the substrate, the first fin-shaped structure and the second fin-shaped structure;

etching back the dielectric layer to form an isolation feature between the first fin-shaped structure and the second fin-shaped structure such that a top portion of the first fin-shaped structure and a top portion of the second fin-shaped structure extend above the isolation feature, wherein the etching back removes the first silicon liner over the top portion of the first fin-shaped structure and the top portion of the second fin-shaped structure to expose sidewalls of the plurality of channel layers and the plurality of sacrificial layers; and epitaxially depositing a second silicon liner over the exposed sidewalls of the plurality of channel layers and the plurality of sacrificial layers.

2. The method of claim 1,
wherein the first silicon liner includes a first thickness,
wherein the second silicon liner includes a second thickness smaller than the first thickness.

3. The method of claim 2,
wherein the first thickness is between about 1.5 nm and about 2.0 nm,
wherein the second thickness is between about 0.4 nm and about 0.6 nm.

4. The method of claim 1, wherein the epitaxially depositing of the first silicon liner comprises disilane as a precursor and a process temperature between 360° C. and about 400° C.

5. The method of claim 1, further comprising:
depositing a dummy gate stack over a channel region of the fin-shaped structure, wherein the dummy gate stack is disposed on the second silicon liner;
depositing a gate spacer layer over the dummy gate stack;
recessing a source/drain region of the fin-shaped structure to form a source/drain recess;
forming a source/drain feature in the source/drain recess; and
depositing an interlayer dielectric layer over the source/drain feature.

6. The method of claim 5, further comprising:
removing the dummy gate stack;
removing the second silicon liner over the top portion of the first fin-shaped structure and the top portion of the second fin-shaped structure to expose sidewalls of the plurality of channel layers and the plurality of sacrificial layers;
selectively removing the plurality of sacrificial layers to release the plurality of channel layers as a plurality of channel members; and
forming a gate structure to surround each of the plurality of channel members.

7. The method of claim 6, wherein the removing of the second silicon liner comprises: converting the second silicon liner into a silicon oxide layer; and
selectively removing the silicon oxide layer.

8. The method of claim 7, wherein the selectively removing of the silicon oxide layer comprises use of hydrogen fluoride (HF) and ammonia ($NH_3$).

9. A method, comprising:
forming, on a substrate, a first fin-shaped structure and a second fin-shaped structure each comprising a plurality of channel layers interleaved by a plurality of sacrificial layers;
epitaxially depositing a silicon liner of a first thickness over the first fin-shaped structure and the second fin-shaped structure;

depositing a dielectric layer over the substrate, the first fin-shaped structure and the second fin-shaped structure; and etching back the dielectric layer to form an isolation feature between the first fin-shaped structure and the second fin-shaped structure such that a top portion of the first fin-shaped structure and a top portion of the second fin-shaped structure extend above the isolation feature, wherein the etching back reduces the first thickness of the silicon liner over the top portion of the first fin-shaped structure and the top portion of the second fin-shaped structure to a second thickness smaller than the first thickness.

10. The method of claim 9,
wherein the first thickness is between about 1.9 nm and about 2.6 nm,
wherein the second thickness is between about 0.4 and about 0.6.

11. The method of claim 9, wherein the epitaxially depositing of the silicon liner comprises di-silane as a precursor and a process temperature between 360° C. and about 400° C.

12. The method of claim 9, further comprising:
depositing a dummy dielectric layer on the silicon liner over channel regions of the first fin-shaped structure and the second fin-shaped structure;
depositing a dummy electrode layer over the dummy dielectric layer;
depositing a gate spacer layer over the dummy electrode layer;
recessing source/drain regions of the first fin-shaped structure and the second fin-shaped structure to form source/drain recesses;
forming source/drain features in the source/drain recesses; and
depositing an interlayer dielectric layer over the source/drain features.

13. The method of claim 12, further comprising:
removing the dummy electrode layer and the dummy dielectric layer;
removing the silicon liner over the top portion of the first fin-shaped structure and the top portion of the second fin-shaped structure to expose sidewalls of the plurality of channel layers and the plurality of sacrificial layers;
selectively removing the plurality of sacrificial layers to release the plurality of channel layers as a plurality of channel members; and
forming a gate structure to surround each of the plurality of channel members.

14. The method of claim 13, wherein the removing of the silicon liner comprises:
converting the silicon liner into a silicon oxide layer; and
selectively removing the silicon oxide layer.

15. The method of claim 14, wherein the selectively removing of the silicon oxide layer comprises use of hydrogen fluoride (HF) and ammonia ($NH_3$).

16. A method, comprising:
depositing alternatingly a plurality of sacrificial layers and a plurality of channel layers on a substrate such that the plurality of sacrificial layers are interleaved by the plurality of channel layers;
etching the plurality of sacrificial layers, the plurality of channel layers, and the substrate to form a fin-shaped structure, wherein each of the plurality of sacrificial layers in the fin-shaped structure has a first width and each of the plurality of channel layers in the fin-shaped structure has a second width greater than the first width; and epitaxially depositing a silicon liner on the fin-shaped structure, wherein the silicon liner has a first thickness measured from sidewalls of the plurality of sacrificial layers and a second thickness measured from sidewalls of the plurality of channel layers, and wherein a sum of the first width and twice the first thickness is substantially equal to a sum of the second width and twice the second thickness.

17. The method of claim 16,
wherein the plurality of sacrificial layers consist essentially of silicon germanium,
wherein the plurality of channel layers consist essentially of silicon.

18. The method of claim 16, wherein the etching comprises a dry etch process.

19. The method of claim 16, further comprising:
depositing a dummy dielectric layer directly on the silicon liner over a channel region of the fin-shaped structure;
depositing a dummy electrode layer over the dummy dielectric layer;
depositing a gate spacer layer over the dummy electrode layer;
recessing a source/drain region of the fin-shaped structure to form a source/drain recess;
forming a source/drain feature in the source/drain recess; and
depositing an interlayer dielectric layer over the source/drain feature.

20. The method of claim 19, further comprising:
removing the dummy electrode layer and the dummy dielectric layer to expose the silicon liner over the channel region of the fin-shaped structure;
removing the silicon liner over the channel region of the fin-shaped structure to expose sidewalls of the plurality of channel layers and the plurality of sacrificial layers;
selectively removing the plurality of sacrificial layers to release the plurality of channel layers as a plurality of channel members; and
forming a gate structure to surround each of the plurality of channel members.

* * * * *